United States Patent
Tang et al.

(10) Patent No.: US 11,855,198 B2
(45) Date of Patent: Dec. 26, 2023

(54) MULTI-GATE HIGH ELECTRON MOBILITY TRANSISTORS (HEMTS) EMPLOYING TUNED RECESS DEPTH GATES FOR IMPROVED DEVICE LINEARITY

(71) Applicant: QUALCOMM Incorporated, San Diego, CA (US)

(72) Inventors: Chenjie Tang, San Diego, CA (US); Ye Lu, San Diego, CA (US); Peijie Feng, San Diego, CA (US); Junjing Bao, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 96 days.

(21) Appl. No.: 16/844,479

(22) Filed: Apr. 9, 2020

(65) Prior Publication Data
US 2021/0320197 A1 Oct. 14, 2021

(51) Int. Cl.
*H01L 29/778* (2006.01)
*H01L 21/02* (2006.01)
(Continued)

(52) U.S. Cl.
CPC ...... *H01L 29/7786* (2013.01); *H01L 21/0254* (2013.01); *H01L 29/2003* (2013.01);
(Continued)

(58) Field of Classification Search
CPC ............. H01L 21/0254; H01L 29/2003; H01L 29/205; H01L 29/42316; H01L 29/4236; H01L 29/66462; H01L 29/7786
See application file for complete search history.

(56) References Cited

U.S. PATENT DOCUMENTS 7,692,263 B2 * 4/2010 Wu ..................... H01L 29/2003
257/E21.403
7,838,904 B2 * 11/2010 Nakazawa .......... H01L 29/7787
257/E29.246
(Continued)

FOREIGN PATENT DOCUMENTS

EP       2881992 A1    6/2015
WO   2019066878 A1    4/2019

OTHER PUBLICATIONS

Khalil I., et al., "Improving the Linearity of GaN HEMTs by Optimizing Epitaxial Structure", IEEE Transactions on Electron Devices, vol. 56, No. 3, Mar. 2009, pp. 361-364.
(Continued)

*Primary Examiner* — Jay C Kim
(74) *Attorney, Agent, or Firm* — Withrow & Terranova, PLLC

(57) ABSTRACT

A multi-gate HEMT includes at least two gates, with at least one recessed the same depth or at a deeper depth in a barrier layer than at least one other gate. Recessing a gate decreases the thickness of the barrier layer beneath the gate, reducing a density of high mobility carriers in a two-dimensional electron gas layer (2DEG) conductive channel formed at the heterojunction of a barrier layer and a buffer layer below the recessed gate. The recessed gate can increase gate control of the 2DEG conductive channel. The multi-gate HEMT has at least one gate recessed the same depth or a deeper depth into the buffer layer than another gate, which forms at least two different turn-on voltages for different gates. This can achieve improvement of transconductance linearity and a positive shift of the threshold voltage.

9 Claims, 12 Drawing Sheets

(51) Int. Cl.
*H01L 29/20* (2006.01)
*H01L 29/205* (2006.01)
*H01L 29/423* (2006.01)
*H01L 29/66* (2006.01)

(52) U.S. Cl.
CPC ........ *H01L 29/205* (2013.01); *H01L 29/4236* (2013.01); *H01L 29/42316* (2013.01); *H01L 29/66462* (2013.01)

(56) References Cited

U.S. PATENT DOCUMENTS

| | | | |
|---|---|---|---|
| 7,863,648 B2 | 1/2011 | Miyamoto et al. | |
| 7,875,907 B2* | 1/2011 | Honea | H01L 27/0605 257/192 |
| 7,999,289 B2* | 8/2011 | Suzuki | H01L 27/0605 257/195 |
| 8,198,652 B2* | 6/2012 | Ando | H01L 29/7787 257/192 |
| 8,198,653 B2* | 6/2012 | Imada | H01L 29/66462 257/E21.403 |
| 8,283,699 B2* | 10/2012 | Wu | H01L 29/205 257/192 |
| 8,421,123 B2* | 4/2013 | Machida | H01L 29/7787 257/195 |
| 8,552,471 B2* | 10/2013 | Okamoto | H01L 29/402 257/194 |
| 8,587,031 B2* | 11/2013 | Lu | H01L 29/66 257/194 |
| 8,710,550 B2* | 4/2014 | Ishigaki | H01L 29/66 257/192 |
| 8,729,558 B2* | 5/2014 | Kuraguchi | H01L 29/42316 257/76 |
| 8,765,554 B2* | 7/2014 | Imada | H03F 1/3247 438/176 |
| 8,816,395 B2* | 8/2014 | Bunin | H01L 29/7783 257/194 |
| 8,872,232 B2* | 10/2014 | Imada | H01L 29/861 257/194 |
| 8,912,571 B2* | 12/2014 | Kanamura | H01L 29/7787 257/194 |
| 8,928,003 B2* | 1/2015 | Ueno | H01L 29/778 257/76 |
| 8,933,486 B2* | 1/2015 | Wu | H01L 29/7786 257/195 |
| 8,969,973 B2 | 3/2015 | Takatani | |
| 9,082,691 B2* | 7/2015 | Yoshioka | H01L 29/0619 |
| 9,087,718 B2* | 7/2015 | Lal | H01L 29/66522 |
| 9,147,738 B2* | 9/2015 | Jeon | H01L 29/42316 257/194 |
| 9,337,332 B2* | 5/2016 | Chu | H01L 29/7786 |
| 9,343,562 B2* | 5/2016 | Briere | H01L 29/7786 |
| 9,461,122 B2* | 10/2016 | Kuraguchi | H01L 29/2003 |
| 9,502,549 B2* | 11/2016 | Ikoshi | H01L 29/66462 |
| 9,647,103 B2* | 5/2017 | Koudymov | H01L 29/402 |
| 9,679,981 B2 | 6/2017 | Sriram et al. | |
| 9,755,059 B2* | 9/2017 | Sriram | H01L 29/402 |
| 9,847,411 B2* | 12/2017 | Sriram | H01L 29/778 257/194 |
| 9,960,264 B1 | 5/2018 | Chen et al. | |
| 10,103,239 B1 | 10/2018 | Chou et al. | |
| 10,229,912 B2* | 3/2019 | Sato | H01L 27/095 257/192 |
| 10,276,712 B2* | 4/2019 | Chu | H01L 29/7827 257/76 |
| 10,381,470 B2* | 8/2019 | Iucolano | H01L 29/66462 |
| 10,431,657 B1* | 10/2019 | Shindome | H01L 29/7786 |
| 10,439,057 B2 | 10/2019 | Jun et al. | |
| 10,446,675 B2* | 10/2019 | Sizov | H01L 29/7786 |
| 10,566,450 B2* | 2/2020 | Iucolano | H01L 29/7786 |
| 10,573,735 B2* | 2/2020 | Koyama | H01L 29/7783 257/76 |
| 10,714,605 B2* | 7/2020 | Moon | H01L 29/7783 |
| 10,868,163 B2* | 12/2020 | Hung | H01L 29/42376 |
| 10,872,967 B2 | 12/2020 | Shih et al. | |
| 10,910,490 B2* | 2/2021 | Kuraguchi | H01L 29/7786 257/194 |
| 10,923,586 B2* | 2/2021 | Chiang | H01L 29/66431 |
| 10,985,271 B2* | 4/2021 | Yang | H01L 21/0254 |
| 11,127,847 B2* | 9/2021 | Lee | H01L 21/0254 |
| 11,264,492 B2* | 3/2022 | Huang | H01L 29/2003 |
| 11,296,214 B2* | 4/2022 | Lee | H01L 29/7787 |
| 11,316,038 B2* | 4/2022 | Iucolano | H01L 29/7838 |
| 11,322,599 B2* | 5/2022 | Neufeld | H01L 29/7786 |
| 11,329,148 B2* | 5/2022 | Chen | H01L 21/02579 |
| 11,515,408 B2* | 11/2022 | Chen | H01L 21/02433 |
| 2009/0206363 A1* | 8/2009 | Machida | H01L 29/7787 257/133 |
| 2011/0260217 A1* | 10/2011 | Okamoto | H01L 29/41766 257/194 |
| 2014/0151747 A1* | 6/2014 | Jeon | H01L 29/42316 257/194 |
| 2014/0264360 A1* | 9/2014 | Huang | H01L 29/2003 257/268 |
| 2015/0263103 A1* | 9/2015 | Saito | H01L 29/205 257/356 |
| 2017/0352753 A1* | 12/2017 | Nagahisa | H01L 29/7787 257/192 |
| 2018/0374943 A1 | 12/2018 | Liu et al. | |
| 2020/0075314 A1* | 3/2020 | Chen | H01L 29/7786 |
| 2020/0219772 A1* | 7/2020 | Ramaswamy | H01L 21/8252 |

OTHER PUBLICATIONS

Liu Z.H., et al., "Improved Linearity for Low-Noise Applications in 0.25-μm GaN MISHEMTs Using ALD Al2O3 as Gate Dielectric", IEEE Electron Device Letters, vol. 31, No. 8, Aug. 2010, pp. 803-805.

Tang C., et al., "Simulation of GaN HEMT with Wide-Linear-Range Transconductance", 2017, 4 pages.

International Search Report and Written Opinion for International Patent Application No. PCT/US2021/026366, dated Jun. 25, 2021, 14 pages.

* cited by examiner

MULTI-GATE HIGH ELECTRON MOBILITY TRANSISTORS (HEMTS) EMPLOYING TUNED RECESS DEPTH GATES FOR IMPROVED DEVICE LINEARITY

BACKGROUND

I. Field of the Disclosure

The field of the disclosure relates to electronic circuits for wireless devices, and, more particularly, to high electron mobility transistors (HEMTs) for use in circuit applications, such as radio frequency (RF) circuits.

II. Background

High electron mobility transistors (HEMTs) are playing a crucial role in advanced radio frequency (RF) and microwave applications, including 5G networks, due to their high power and high frequency capabilities. In contrast to a metal-oxide semiconductor (MOS) field-effect transistor (FET) (MOSFET) in which a conduction channel is formed in a doped region, a HEMT conduction channel is formed in a HEMT at the intersection of two materials having different band gaps disposed in contact with each other. A barrier layer is a wide band-gap donor-supply layer disposed in contact above a narrow band-gap channel layer ("buffer layer"). A heterojunction is created at the intersection of the barrier layer and the buffer layer. The conduction channel in a HEMT can be gate controlled to form a two-dimensional electron gas (2DEG) layer, which is a very thin layer of highly mobile conducting electrons with very high concentration formed at the heterojunction. The 2DEG layer a HEMT to support high mobility electrons in with no dopant impurities. The HEMT includes a source and a drain that have ohmic contacts to opposite ends of the 2DEG conduction channel. The source and drain may be conductively coupled to each other via the 2DEG depending on a voltage applied to a gate terminal on the barrier layer of the HEMT.

Gallium nitride (GaN) is a material commonly employed in HEMTs, because GaN offers superior properties of high power density, power added efficiency (PAE), gain, and ease in impedance matching, which improves overall efficiency in an RF chain (e.g., RF circuit in a wireless device). Linearity is an important factor for RF amplifiers. Ideally, a FET device would possess constant (linear) transconductance ($g_m$) over a wide range of input gate-source voltages. To reduce the burden of linearization techniques for 5G amplifiers (i.e., methods of making a 5G amplifier perform linearly), alternative methods are provided in HEMTs at the device level for improved linearity. Methods to increase transconductance linearity in conventional GaN HEMTs have included increasing gate-to-channel distance, using atomic layer deposition (ALD) to form an aluminum oxide ($Al_2O_3$) gate insulator for a metal-insulator-semiconductor HEMT (MISHEMT), and inserting a delta-doped layer in the GaN buffer layer. These approaches result in either reducing the range of operation in which the transconductance remains approximately linear, or shifting the threshold voltage ($V_{th}$) of the HEMT to a more negative voltage, causing the HEMT to operate in depletion mode rather than the preferred enhancement mode (e-mode). In depletion mode, the 2DEG conductive channel is conductive unless conduction is interrupted by gate control. Thus, in depletion mode, a HEMT is normally on, which is a major drawback for safety and circuit design.

In this regard, a conventional recessed-gate aluminum gallium nitride (AlGaN)/GaN HEMT 100 ("HEMT 100") is shown in FIG. 1 that operates in e-mode, meaning the transistor is normally off in the absence of an applied gate voltage. The HEMT 100 includes a barrier layer 102 of AlGaN and a buffer layer 104 of GaN to form a 2DEG conductive channel 106 ("2DEG 106") at a heterojunction 108 where the barrier layer 102 and the buffer layer 104 intersect. The heterojunction 108 and 2DEG 106 extend in an X-axis direction. The buffer layer 104 is formed on a silicon carbide (SiC) substrate 110. A source 112S and a drain 112D are electrically coupled to the 2DEG 106 at opposite ends of the barrier layer 102 in the X-axis direction. A gate 114 is recessed in a Y-axis direction into the barrier layer 102, and a passivation layer 116 is formed over the surface of the barrier layer 102. Recessing the gate 114 into the barrier layer 102 reduces the thickness in the Y-axis direction of the barrier layer 102 under the gate 114, causing the Fermi level at the AlGaN/GaN heterojunction 108 to fall below the minimum conduction band of the barrier layer 102. This depletes the 2DEG 106 of high mobility carriers creating an opening 118 in the 2DEG 106. The length Lg of the gate 114 in the X-axis direction between the source 112S and the drain 112D determines the size of the opening 118. Recessing the gate 114 positively shifts the threshold voltage, moving operation of the HEMT 100 toward normally-off operation (e-mode). In response to a positive voltage above the threshold voltage being applied to the gate 114, high mobility carriers are restored to the opening 118, and the depleted 2DEG 106 becomes conductive. However, it is difficult to improve linearity of the transconductance of recessed-gate HEMT 100 in FIG. 1, because intentionally making the gate-to-channel distance very small to achieve a more positive threshold voltage reduces carrier concentration in the 2DEG 106, thus negatively impacting transconductance linearity.

SUMMARY OF THE DISCLOSURE

Aspects disclosed herein include multi-gate high electron mobility transistors (HEMTs) employing tuned recess depth gates for improved device linearity. In exemplary aspects, a multi-gate HEMT is provided that includes at least two gates, with at least one of the gates recessed the same depth or at a deeper depth in the barrier layer than at least one other gate. Recessing a gate into the barrier layer of a HEMT decreases the thickness of the barrier layer beneath the gate, thus reducing a density of high mobility carriers in a two-dimensional electron gas layer (2DEG) conductive channel formed at the heterojunction of a barrier layer and a buffer layer below the recessed gate. This can shift the threshold voltage of the HEMT, which moves the HEMT toward enhancement mode (e-mode or normally-off) operation. The recessed gate being closer to the 2DEG conductive channel can also increase gate control of the 2DEG conductive channel. In exemplary aspects disclosed herein, the multi-gate HEMT has at least one gate recessed the same depth or a deeper depth into the buffer layer than another gate, which allows a smaller region of the barrier layer to be reduced in thickness than if all gates were recessed (e.g., to a lesser depth). This can achieve a positive shift of the threshold voltage with less, if any, negative impact to the range of transconductance linearity in the multi-gate HEMT. Increased transconductance linearity in the multi-gate HEMT means that the transconductance remains closer to a peak level of transconductance of the multi-gate HEMT over a larger range of input voltage. This is compared to a conventional HEMT that includes a single, larger recessed gate in which a positive threshold voltage is attained at the expense of a decreased range of linear transconductance.

The multi-gate HEMT can also include an additional gate(s) that is not recessed into the barrier layer. Further, the recess depths of the gates of the multi-gate HEMT can also be tuned for a desired combination of transconductance linearity and positive shift in the threshold voltage. In addition, the distance(s) between the respective gates in a multi-gate HEMT can also be adjusted to further tune the threshold voltage and transconductance linearity (GVS). GVS is a measure of linearity of transconductance over a range of gate-to-source voltages Vg, which is defined as a voltage range over which the transconductance of a HEMT remains at or above 80% of peak transconductance.

In this regard, in one exemplary aspect, a HEMT is disclosed. The HEMT includes a buffer layer on a substrate, a barrier layer on the buffer layer, and a 2DEG conductive channel at a heterojunction between the buffer layer and a bottom surface of the barrier layer. The HEMT further includes a source and a drain each electrically coupled to the 2DEG conductive channel, a first gate including a bottom surface in direct contact with the barrier layer between the source and the drain, and a second gate between the first gate and the drain, with the second gate including a second bottom surface of the second gate in direct contact with the barrier layer and recessed a depth into the barrier layer below the bottom surface of the first gate. A length of the first gate extends in a direction from the source to the drain, and a length of the second gate extends in the direction.

In another exemplary aspect, a HEMT is disclosed. The HEMT includes a buffer layer on a substrate, a barrier layer on the buffer layer, and a 2DEG conductive channel at a heterojunction between the buffer layer and a bottom surface of the barrier layer. The HEMT further includes a source and a drain each electrically coupled to the 2DEG conductive channel. The HEMT further includes a first gate including a bottom surface on the barrier layer between the source and the drain and a first gate insulator between the bottom surface of the first gate and the barrier layer. The HEMT further includes a second gate between the first gate and the drain, the second gate including a second bottom surface recessed a depth into the barrier layer deeper than the bottom surface of the first gate, and a second gate insulator between the second bottom surface of the second gate and the barrier layer. A length of the first gate extends in a direction from the source to the drain, and a length of the second gate extends in the direction.

In another exemplary aspect, a HEMT is disclosed. The HEMT includes a buffer layer above a substrate, a barrier layer above the buffer layer, and a 2DEG conductive channel at a heterojunction between the buffer layer and a bottom surface of the barrier layer. The HEMT further includes a source and a drain each electrically coupled to the 2DEG conductive channel. The HEMT further includes a first gate including a bottom surface in direct contact with the barrier layer between the source and the drain, and a second gate between the first gate and the drain, the second gate including a second bottom surface in direct contact with the barrier layer and recessed a depth into the barrier layer deeper than the bottom surface of the first gate, and a third gate between the second gate and the drain, the third gate including a third bottom surface of the third gate in direct contact with the barrier layer and recessed a depth into the barrier layer the same or deeper than the depth of the second bottom surface of the second gate in the barrier layer. A length of the first gate extends in a direction from the source to the drain, a length of the second gate extends in the direction, and a length of the third gate extends in the direction.

In another exemplary aspect, a method of fabricating a HEMT is disclosed. The method includes forming a buffer layer above a substrate. The method also includes disposing a barrier layer above the buffer layer to form a 2DEG conductive channel. The method also includes removing portions of the barrier layer from the buffer layer at each end of the 2DEG conductive channel. The method also includes forming a source and a drain on the buffer layer at respective ends of the 2DEG conductive channel where the portions of the barrier layer are removed. The method also includes recessing the barrier layer to form a recessed gate location. The method also includes forming a first gate in a first gate location on the barrier layer. The method also includes forming a second gate in the recessed gate location on the barrier layer. The method also includes depositing a passivation layer on the barrier layer.

DETAILED DESCRIPTION

Figure 1:
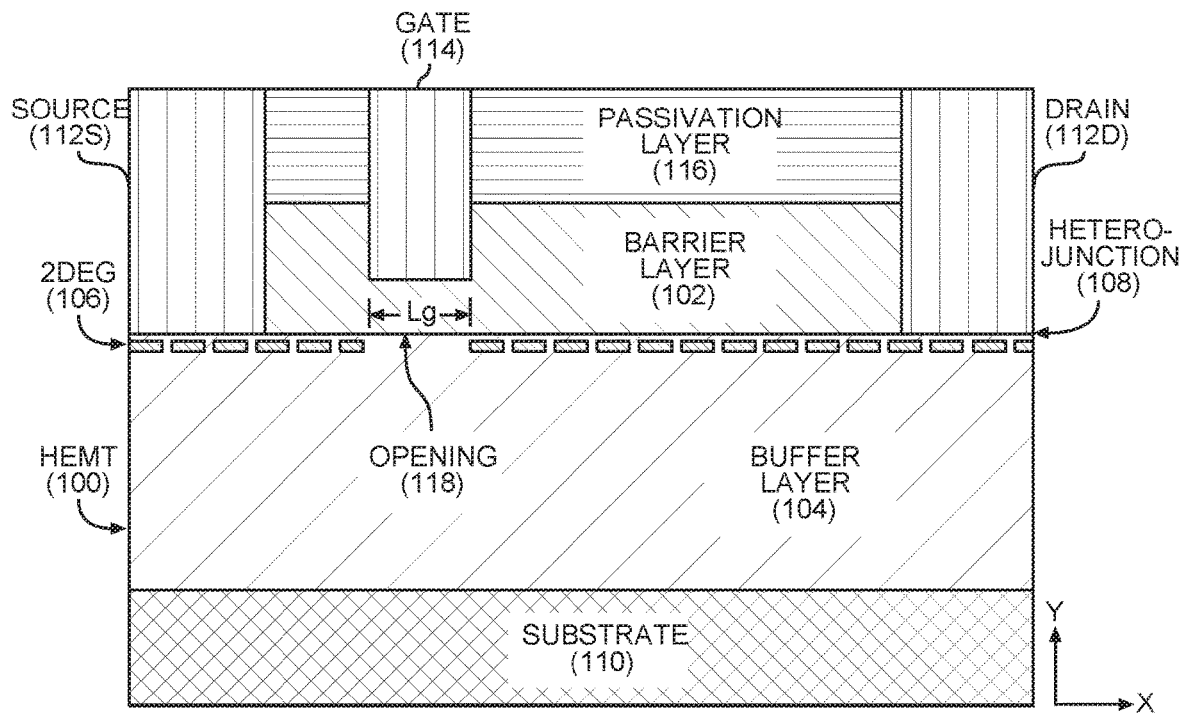
FIG. 1 is a cross-sectional side view of a conventional high electron mobility transistor (HEMT) with a single recessed gate for enhancement mode (e-mode) operation.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include multi-gate high electron mobility transistors (HEMTs) employing tuned recess depth gates for improved device linearity. In exemplary aspects, a multi-gate HEMT is provided that includes at least two gates, with at least one of the gates recessed the same depth or at a deeper depth in the barrier layer than at least one other gate. Recessing a gate into the barrier layer of a HEMT decreases the thickness of the barrier layer beneath the gate, thus reducing a density of high mobility carriers in a two-dimensional electron gas layer (2DEG) conductive channel formed at the heterojunction of a barrier layer and a buffer layer below the recessed gate. This can shift the threshold voltage of the HEMT, which moves the HEMT toward enhancement mode (e-mode or normally-off) operation. The recessed gate being closer to the 2DEG conductive channel can also increase gate control of the 2DEG conductive channel. In exemplary aspects disclosed herein, the multi-gate HEMT has at least one gate recessed the same depth or a deeper depth into the buffer layer than another gate, which allows a smaller region of the barrier layer to be reduced in thickness than if all gates were recessed to a lesser depth. This can achieve a positive shift of the threshold voltage with less, if any, negative impact to the range of transconductance linearity in the multi-gate HEMT. Increased transconductance linearity in the multi-gate HEMT means that the transconductance remains closer to a peak level of transconductance of the multi-gate HEMT over a larger range of input voltage. This is compared to a conventional HEMT that includes a single, larger recessed gate in which a positive threshold voltage is attained at the expense of a decreased range of linear transconductance.

The multi-gate HEMT can also include an additional gate(s) that is not recessed into the barrier layer. Further, the recess depths of the gates of the multi-gate HEMT can also be tuned for a desired combination of transconductance linearity and positive shift in the threshold voltage. In addition, the distance(s) between the respective gates in a multi-gate HEMT can also be adjusted to further tune the threshold voltage and transconductance linearity (GVS). GVS is a measure of linearity of transconductance over a range of gate-to-source voltages Vg, which is defined as a voltage range over which the transconductance of a HEMT remains at or above 80% of peak transconductance.

Referring back to the HEMT 100 in FIG. 1, the single gate 114 extends the length Lg in the X-axis direction between the source 112S and the drain 112D, and a gate-to-source voltage applied to the gate 114 asserts influence on the 2DEG 106 over the length Lg. In contrast to the HEMT 100, an exemplary HEMT 200 including a first gate 202 and a second gate 204 is illustrated in cross-section in FIG. 2. The HEMT 200 has two separate gates 202, 204 on a barrier layer 206. The multi-gate structure of the HEMT 200 includes the second gate 204 including a bottom surface $204_{BOT}$ that is recessed a depth in the Y-axis direction that is deeper than a bottom surface $202_{BOT}$ of the first gate 202, to positively shift a threshold voltage and improve transconductance linearity of the HEMT 200. With certain recessed depths of first gate 202 and second gate 204 combinations, the HEMT 200 can achieve enhancement mode (e-mode or normally-off) operation. A length Lg1 of the first gate 202 and a length Lg2 of the second gate 204 are also measured in the X-axis direction between a source 208S and a drain 208D of the HEMT 200, as shown in the cross-section in FIG. 2. In the example of the HEMT 200, the length Lg1 of the first gate 202 is equal to the length Lg2 of the second gate 204 (i.e., Lg1=Lg2), and a total of the combined lengths (i.e., Lg1+Lg2) of the first and second gates 202 and 204 is equal to the length Lg of the gate 114 of the HEMT 100 in FIG. 1. In other examples, the length Lg1 of the first gate 202 may not be equal to the length Lg2 of the second gate 204, and the total combined lengths (Lg1+Lg2) may be more or less than a length of a gate in a single recessed-gate HEMT.

The second gate 204 is recessed to a second gate depth Lg2_rs into the barrier layer 206, such that a bottom surface $204_{BOT}$ of the second gate 204 is below (i.e., further recessed than) a bottom surface $202_{BOT}$ of the first gate 202. The first gate depth Lg1_rs and the second gate depth Lg2_rs are distances in the Y-axis direction from a top surface $206_{TOP}$ of the barrier layer 206 to the bottom surfaces $202_{BOT}$ and $204_{BOT}$, respectively. The first gate 202 may be recessed to a first gate depth Lg1_rs below the top surface $206_{TOP}$ of the barrier layer 206, however the first gate 202 is not recessed (i.e., Lg1_rs=0) in the example in FIG. 2. By adjusting ("tuning") the first and second gate depths Lg1_rs and Lg2_rs, a positive shift in threshold voltage can be achieved. In addition, by tuning the second gate depth Lg2_rs to a different depth greater than the first gate depth Lg1_rs, the HEMT 200 has a greater linear range of transconductance than the HEMT 100, making the HEMT 200 more attractive for RF applications.

Another aspect of tuning the first gate 202 and the second gate 204 refers to a distance Lg12_dist in the X-axis direction between the first gate 202 and the second gate 204 in the direction between the source 208S and the drain 208D. In one example, the distance Lg12_dist may be in the range from 0 microns (μm) to 2.0 μm. At the minimum of such range, the first gate 202 and the second gate 204 are in contact with each other and may be connected together, but have different depths Lg1_rs and Lg2_rs. By adjusting the distance Lg12_dist, in combination with tuning the first gate depth Lg1_rs and the second gate depth Lg2_rs, the positive shift of the threshold voltage and the range of linearity of transconductance of the HEMT 200 can be varied.

Further details of the first gate 202 and the second gate 204 are presented in the context of the HEMT 200. The first gate 202 and the second gate 204 are each formed of a conductive metal or metal stack. The bottom surface 202$_{BOT}$ of the first gate 202 and the bottom surface 204$_{BOT}$ of the second gate 204 are both in direct contact with the barrier layer 206, which is a semiconductor material of aluminum gallium nitride (AlGaN) in the multi-gate HEMT 200. That is, in the absence of any intervening material, a Schottky contact is formed between the first gate 202 and the barrier layer 206. Similarly, a Schottky contact is also formed between the second gate 204 and the barrier layer 206. The Schottky contact, which is a direct metal to semiconductor contact, influences the threshold voltage, leakage currents, breakdown voltage, and contact resistance of the HEMT 200. As an example of the composition of the barrier layer 206, an AlGaN barrier layer 206 may have an aluminum (Al) alloy percentage in the range of 20% to 30%.

The top surface 206$_{TOP}$ and the bottom surface 206$_{BOT}$ of the barrier layer 206 extend in the X-axis direction.

The barrier layer 206 is disposed on a buffer layer 210 of gallium nitride (GaN). As described above, a two-dimensional electron gas layer (2DEG) conductive channel 212 ("2DEG 212") is formed at a heterojunction 214 where the barrier layer 206 and the buffer layer 210 intersect. The heterojunction 214 is the interface between two layers of dissimilar crystalline semiconductors (i.e., the buffer layer 210 and the barrier layer 206). The barrier layer 206 is a wide band-gap donor-supply layer and the buffer layer 210 is a narrow band-gap channel layer. A 2DEG 212 is a very thin layer of highly mobile conducting electrons that collect at a high concentration at the heterojunction 214. Below the second gate 204, which is recessed to the second gate depth Lg2_rs, a thickness $T_{204}$ in the Y-axis direction of the barrier layer 206 is thinner than a thickness $T_{206}$, of the barrier layer 206 where no gate is present. In addition to thinning the barrier layer 206, the second gate 204 being recessed closer to the 2DEG 212 increases the control the second gate 204 has over the 2DEG 212. Due to the thinner barrier layer 206 below the second gate 204, the concentration of high mobility carriers in the 2DEG 212 beneath the second gate 204 is depleted, thereby creating an opening 216 or gap in the conductivity of the 2DEG 212. The opening 216 causes the HEMT 200 to have a normally-off state (i.e., non-conductive even in the presence of a voltage between the source 208S and the drain 208D). However, the opening 216 is smaller in the X-axis direction than the opening 118 in the 2DEG 106 of the HEMT 100 in FIG. 1 because the length Lg2 of the second gate 204 in the X-axis direction is smaller than the length Lg of the gate 114. Thus, when a gate-to-source voltage is applied to the first gate 202 and to the second gate 204, together they increase the conductance of the 2DEG 212, restoring high mobility carriers to the opening 216 and turning on the HEMT 200. A multi-gate HEMT 200 having the second gate 204 recessed the same depth or deeper into the barrier layer 206 as the first gate 202 causes less of the barrier layer 206 to be reduced in thickness, which achieves a positive shift of the threshold voltage without the decreased range of transconductance linearity (GVS) incurred in the HEMT 100 in FIG. 1. Under the combined effects of the first gate 202 and the second gate 204, the linearity of transconductance of the HEMT 200 is increased compared to the transconductance of the HEMT 100 with a single larger recessed gate 114.

The HEMT 200 remains in the off state unless a gate-to-source voltage greater than or equal to the threshold voltage is applied. In the HEMT 200, a same gate-to-source voltage is applied between the first gate 202 and the source 208S as is applied between the second gate 204 and the source 208S. In other examples, different gate-to-source voltages may be applied to the first gate 202 and the second gate 204. In the HEMT 200 in FIG. 2, applying the same gate-to-source voltage to the first gate 202 and the second gate 204 restores high mobility carriers to the opening 216 in the 2DEG 212, forming a conductive channel between the source 208S and the drain 208D, and turning on the HEMT 200.

The buffer layer 210 in the HEMT 200 is GaN to correspond to the AlGaN in the barrier layer 206. The buffer layer 210 is formed on a substrate 218 of silicon carbide (SiC). The HEMT 200 also includes a passivation layer 220 on the top surface 206$_{TOP}$ of the barrier layer 206. The term "top surface" of a layer or structure in the figures herein means a surface that is highest in the Y-axis direction in the figure and "bottom surface" refers to a surface that is lowest in the Y-axis direction in the figure. The top surface 206$_{TOP}$ of the barrier layer 206 extends over a majority of the barrier layer 206 in the X-axis direction where there is no gate. A top surface 200$_{TOP}$ of the HEMT 200 is planarized (reduced in the Y-axis direction) such that top surfaces of the source 208S, the drain 208D, the first gate 202, the second gate 204, and the passivation layer 220 form the top surface 200$_{TOP}$ of the HEMT 200.

Figure 2:
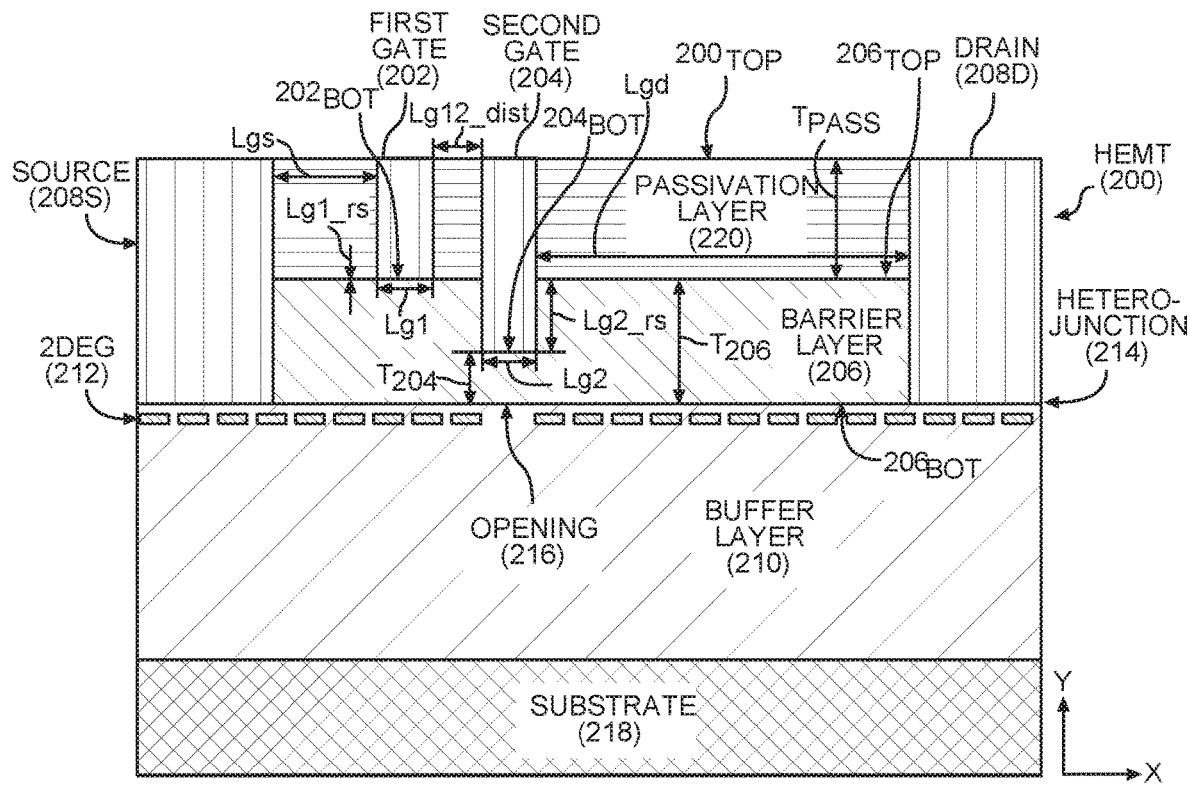
FIG. 2 is a cross-sectional side view of an exemplary multi-gate HEMT having tuned recess depth gates, wherein the multi-gate HEMT includes a first Schottky gate recessed into a barrier layer at the same depth or deeper depth than a second Schottky gate, to increase linearity of the transconductance of the HEMT and positively shift a threshold voltage.

The example of the HEMT 200 in FIG. 2 is formed with the following dimensions. The buffer layer 210 in FIG. 2 is about 2.0 microns (μm) thick. Herein, the term "about" in reference to a numerical value indicates values in a range of 10% more or less than the numerical value. The barrier layer 206 in FIG. 2 has the thickness $T_{206}$ of about 20 nanometers (nm) but may be anywhere in the range from 15 nm to 40 nm thick. The lengths Lg1 and Lg2 and the distance Lg12_dist between the first gate 202 and the second gate 204 are all 0.2 μm. However, the distance Lg12_dist can be in the range between 0 μm and 2.0 μm. In another variation, discussed below, the lengths Lg1 and Lg2 may each be tuned within the range of about 30 nm to about 2.0 μm, and the opening 216 would have a corresponding size.

With further reference to the HEMT 200, the first gate 202 is spaced from the source 208S by a distance Lgs of 1.0 μm in the X-axis direction and spaced from the drain 208D by a distance Lgd of 2.0 μm in the X-axis direction. However, the distance Lgs may be in a range from one (1) to three (3) μm and the distance Lgd may be in a range from one (1) to ten (10) μm. Each of the source 208S and the drain 208D are 0.5 μm in width in the X-axis direction. The first gate depth Lg1_rs is 0 nm in FIG. 2, as noted above, and the second gate depth Lg2 is 15 nm. The depth Lg1_rs of the first gate 202 may be in the range from 0 nm to the depth Lg2_rs of the second gate 204. The depth Lg2_rs of the second gate 204 may be in the range from a depth greater than the depth Lg1_rs of the first gate 202 to a depth corresponding to the thickness $T_{206}$ of the barrier layer 206. That is $0 \leq Lg1\_rs < Lg2\_rs \leq T_{206}$.

Thus, the bottom surface 204$_{BOT}$ of the second gate 204 may be recessed a depth into the barrier layer 206 such that the depth that the bottom surface 204$_{BOT}$ of the second gate 204 is recessed into the barrier layer is a distance below the top surface 206$_{TOP}$ of the barrier layer 206 having a range of 5% to 100% of the thickness $T_{206}$ of the barrier layer 206. For example, if the thickness $T_{206}$ of the barrier layer 206 is 20 nm, the depth to which the bottom surface 204$_{BOT}$ of the second gate 204 is recessed below the top surface 206$_{TOP}$ of the barrier layer 206 is in the range of 1.0 nm to 20 nm. The passivation layer 220 in FIG. 2 has a thickness $T_{PASS}$ (i.e., from the top surface $206_{TOP}$ of the barrier layer 206 to the top surface $T_{200}$ of the HEMT 200) of 50 nm to a few micrometers.

Other combinations of materials for the barrier layer 206 and the buffer layer 210 of the HEMT 200 include indium aluminum gallium nitride (InAlGaN)/GaN, InAlN/GaN, AlN/GaN, etc.

Figure 3A:
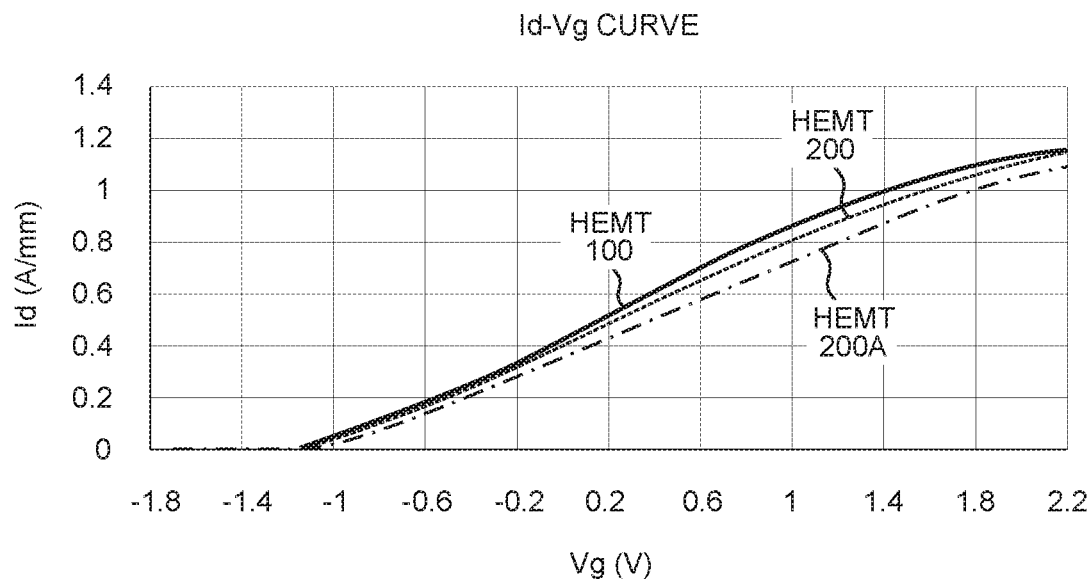
FIGS. 3A and 3B are graphs illustrating simulated drain current and transconductance, respectively, over a range of gate voltages for the conventional HEMT in FIG. 1 with a single recessed gate, as compared to the multi-gate HEMT in FIG. 2 having two (2) gates at different recess depths with a first gate-to-gate distance and another multi-gate HEMT, like the one in FIG. 2, with a second gate-to-gate distance.
Figure 3B:
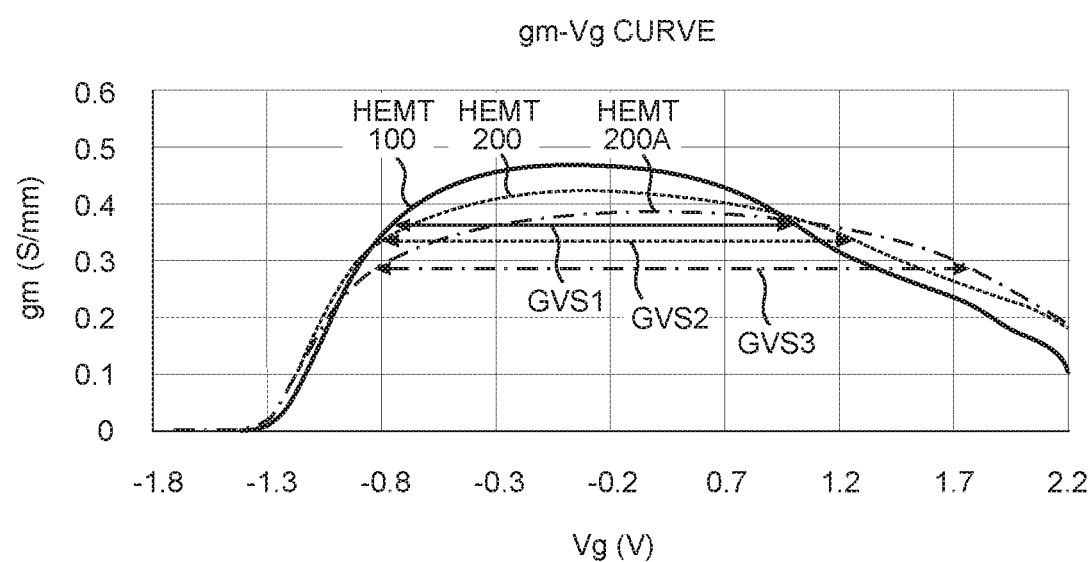

FIG. 3A is a graph illustrating results of simulations of HEMTs including the HEMT 100 in FIG. 1, the HEMT 200 in FIG. 2, and a HEMT 200A, which is the HEMT 200 modified to have a distance Lg12_dist of 0.8 µm between the first gate 202 and the second gate 204. The graph in FIG. 3A shows that the HEMT 200 and the HEMT 200A have similar drain currents $I_d$, over a range of gate-to-source voltages Vg, to the single recessed-gate HEMT 100 in FIG. 1. FIG. 3B illustrates the transconductances ($g_m$) of the HEMT 100, HEMT 200, and HEMT 200A and the values of GVS (i.e., GVS1, GVS2, and GVS3, respectively) for each of HEMT 100, HEMT 200, and HEMT 200A. GVS is a measure of linearity of transconductance over a range of gate-to-source voltages Vg. GVS is voltage range over which the transconductance of a HEMT remains at or above 80% of peak transconductance for that HEMT. A higher GVS is attained by consistent transconductance close to the peak value for a longer range of gate-to-source voltages Vg, which is illustrated as a longer flatter curve in FIG. 3B. As shown, the transconductances of the HEMT 200 and the HEMT 200A remain relatively constant over a greater range of gate-to-source voltages Vg than the HEMT 100. In particular, GVS2 of the HEMT 200 is 23% longer than GVS1 of the HEMT 100, and GVS3 of the HEMT 200A is 42% longer than GVS1. That is, the GVS of a multi-gate HEMT 200A is up to 42% higher than the HEMT 100 in FIG. 1 with a positive shift in threshold voltage. Thus, FIG. 3A shows that the multi-gate HEMT 200 and the HEMT 200A each achieve a similar positive shift in threshold voltage as the single recessed-gate HEMT 100, but FIG. 3B shows that the HEMT 200 and the HEMT 200A have a greater range of transconductance linearity than the HEMT 100.

Figure 4A:
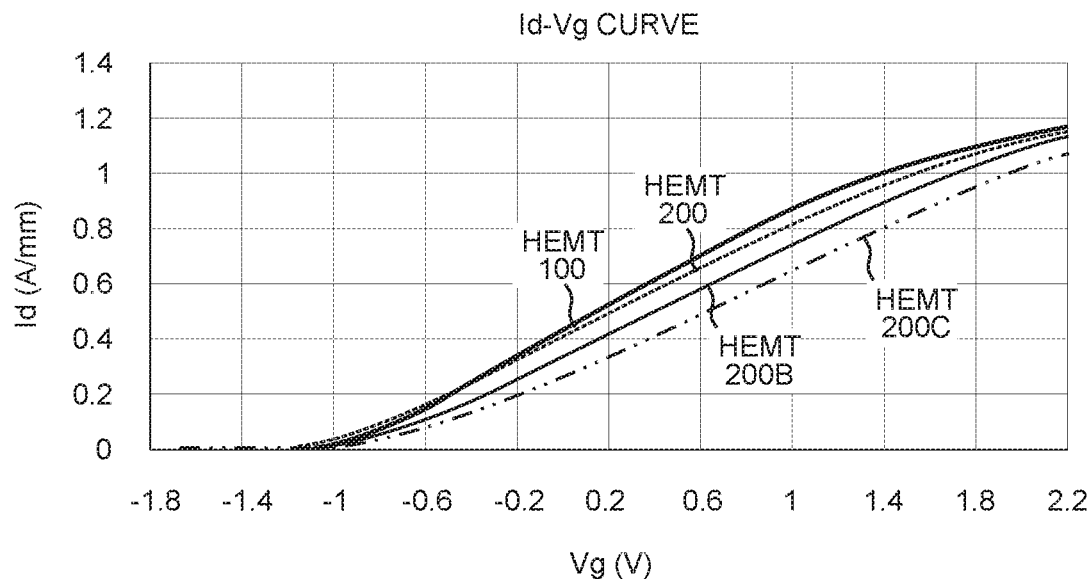
FIGS. 4A and 4B are graphs illustrating simulated drain current and transconductance, respectively, over a range of gate voltages for a conventional HEMT and for three (3) examples of a multi-gate HEMT each employing (2) gates with the second gates in the examples having different gate lengths.
Figure 4B:
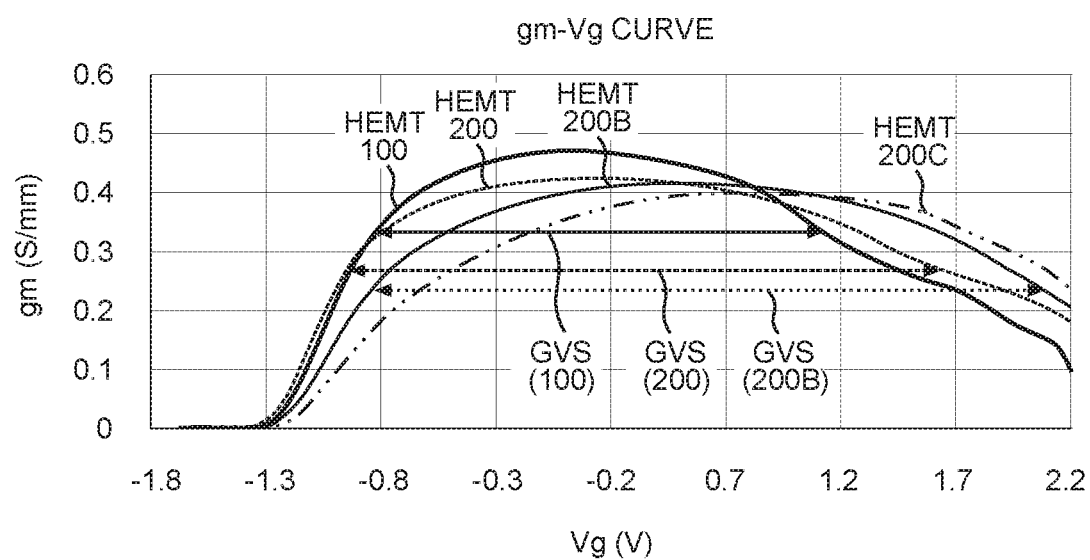

FIGS. 4A and 4B are graphs comparing results of simulations of the HEMT 100 in FIG. 1, the multi-gate HEMT 200 in FIG. 2, and dual-gate HEMTs 200B and 200C. In the HEMT 200, the length Lg2 of the second gate 204 is 0.2 µm. The simulated multi-gate HEMTs 200B and 200C are the same as the HEMT 200 with the exception of the length Lg2 of the second gate 204. In the HEMT 200B, the length Lg2=0.5 µm, and in the HEMT 200C, the length Lg2=1.0 µm. As shown in the results in FIGS. 4A and 4B, the currents $I_d$ in response to a gate-to-source voltage Vg of the HEMTs 200, 200B, and 200C decreased slightly compared to the HEMT 100, but the linear region GVS of transconductance for the HEMT 200 and the HEMT 200B are 23% longer than the GVS of the HEMT 100. The change in GVS in the simulated HEMT 200C was not as significant as the improvement in HEMT 200B, but provides data that is helpful in tuning the various dimensions of the HEMT 200 in FIG. 2.

Figure 5:
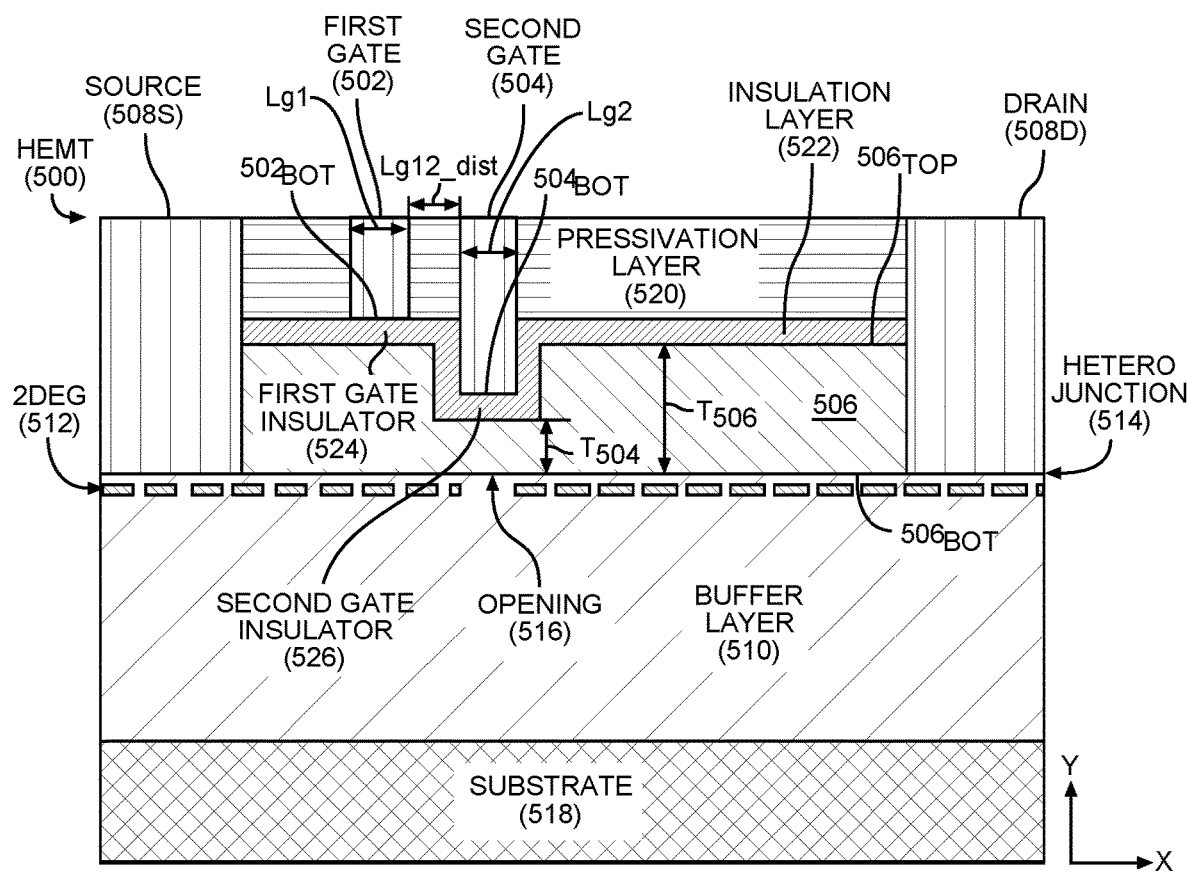
FIG. 5 is cross-sectional side view of an exemplary multi-gate HEMT including a first gate recessed into a barrier layer the same depth or deeper depth than a second gate, wherein both the first and second gates having an insulated contact to the barrier layer to increase linearity of the transconductance of the HEMT and positively shift a threshold voltage.

FIG. 5 is a cross-sectional view of an exemplary HEMT 500, similar to the HEMT 200 in FIG. 2, including a first gate 502, and a second gate 504 including a bottom surface $504_{BOT}$ recessed a depth into a barrier layer 506 in the Y-axis direction deeper than the bottom surface $502_{BOT}$ of the first gate 502. The HEMT 500 includes the barrier layer 506, a source 508S, a drain 508D and a buffer layer 510. As noted above, the barrier layer 506 is a wide band-gap donor-supply layer and the buffer layer 510 is a narrow band-gap channel layer. A 2DEG conductive channel 512 ("2DEG 512") is formed at a heterojunction 514 of the barrier layer 506 and the buffer layer 510 extending in the X-axis direction between the source 508S and the drain 508D. The heterojunction 514 is the interface between the crystalline structure of the wide band-gap barrier layer 506 and the narrow band-gap buffer layer 210. An opening 516 is created in the 2DEG 512 below the second gate 504 where the barrier layer 506 is thinner in the Y-axis direction. The source 508S and the drain 508D are conductively coupled to each other via the 2DEG 512 when high mobility carriers are restored to the opening 516 in response to a gate-to-source voltage applied to the first gate 502 and the second gate 504. In the HEMT 500, in which the second gate 504 is recessed the same depth or a deeper depth (i.e., in the Y-axis direction) into the buffer layer 506 as the first gate 502, the barrier layer 506 is reduced in thickness, from the thickness $T_{506}$ to a thickness $T_{504}$, for example, over a shorter length in the X-axis direction than the length Lg of the gate 114 of the HEMT 100 in FIG. 1. This achieves a positive shift of the threshold voltage with less, if any, decrease of the range of transconductance linearity (GVS) than the HEMT 100 in FIG. 1.

In contrast to the HEMT 200 in FIG. 2, the HEMT 500 includes an insulation layer 522 formed on the barrier layer 506 before the first gate 502 and the second gate 504 are formed. A passivation layer 520 is formed on the insulation layer 522 on a top surface $506_{TOP}$ of the barrier layer 506. The insulation layer 522 may be formed of one or more of many electrically insulating materials, which may include dielectric materials, such as silicon dioxide ($SiO_2$), aluminum oxide ($Al_2O_3$), hafnium oxide ($HfO_2$), lanthanum oxide ($La_2O_3$), titanium dioxide ($TiO_2$), etc. The insulation layer 522 provides a first gate insulator 524 disposed between the bottom surface $502_{BOT}$ of the first gate 502 and the barrier layer 506, and a second gate insulator 526 disposed between the bottom surface $504_{BOT}$ of the second gate 504 and the barrier layer 506. Like the second gate 204, which is recessed a depth into the barrier layer 206 in FIG. 2, the second gate 504 includes a bottom surface $504_{BOT}$ that is recessed a depth into the barrier layer 506 deeper than the bottom surface $502_{BOT}$ of the first gate 502. However, the insulation layer 522 is formed over the barrier layer 506, and the first and second gates 502 and 504 are formed over the insulation layer 522. Thus, the second gate 504 is not in direct contact with the barrier layer 506 and, therefore, does not have a Schottky contact with the barrier layer 506. With the addition of the first gate insulator 524 and the second gate insulator 526, a voltage applied to the first gate 502 and the second gate 504 influences the 2DEG 512 differently than the first gate 202 and the second gate 204 in the HEMT 200 in FIG. 2.

The second gate 504 and the second gate insulator 526 are recessed the same depth or deeper depth into the barrier layer 506 than first gate 502 and the first gate insulator 524. The first gate insulator 524 can be recessed in the barrier layer 506 below the top surface $506_{TOP}$ of the barrier layer 506. In the example in FIG. 5, however, the first gate 502 and the first gate insulator 524 are not recessed into the barrier layer 506. Rather, the first gate insulator 524 is disposed on the top surface $506_{TOP}$ of the barrier layer 506. Because the first gate 502 is formed on the insulation layer 522, the first gate 502 is not in direct contact with the barrier layer 506 and does not have a Schottky contact to the barrier layer 506. The insulation layer 522 changes the influence asserted by the first gate 502 and the second gate 504 on the 2DEG 512 compared to similar gates having Schottky contacts. As described with respect to the HEMT 200 in FIG.

2, by tuning the depths to which the first gate 502 and the second gate 504 are recessed into the barrier layer 506, tuning the distance Lg12_dist between the first gate 502 and the second gate 504, and tuning the lengths Lg1 of the first gate 502 and Lg2 of the second gate 504 in the direction between the source 508S and the drain 508D, the threshold voltage of the HEMT 500 can be shifted towards a more positive voltage, and the range over which the transconductance is linear is increased compared to the HEMT 100 in FIG. 1 with a single recessed gate.

The second gate insulator 526 is recessed in the barrier layer 506 such that depth the second bottom surface $504_{BOT}$ of the second gate 504 is recessed into the barrier layer 506 is a distance below the top surface $506_{BOT}$ of the barrier layer 506 having a range of 5% to 100° % of the thickness $T_{506}$ of the barrier layer 506

As in the HEMT 200 in FIG. 2, in the HEMT 500 the same gate-to-source voltage is applied between the first gate 502 and the source 208S as is applied between the second gate 504 and the source 508S. In other examples, a different gate-to-source voltage may be applied to the first gate 502 than to the second gate 504. Dimensions of features of the HEMT 500 are the same or in the same ranges as those of the HEMT 200 discussed above. For example, the dimensions of the first gate 502 and the second gate 504 in the HEMT 500 correspond to the dimensions of the first gate 202 and the second gate 204 in the HEMT 200. In the example in FIG. 5, the length Lg2 of the second gate 504 in a direction from the source 508S to the drain 508D is equal to the length Lg1 of the first gate 502 in the direction. The distance Lg12_dist between the first gate 502 and the second gate 504 in the direction (i.e., from the source 508S to the drain 508D) is equal to the length Lg1 of the first gate 502 in the same direction. Alternatively, the distance Lg12_dist may be in the range from 0 to 2.0 µm in the direction (from the source 508S to the drain 508D). In the non-limiting example in FIG. 5, Lg1=0.2 µm, Lg2=0.2 µm, and Lg12_dist is in the range of 0.2 µm to 0.8 µm. Alternatively, the length Lg2 may be in the range of 0.2 µm to 1.0 µm.

Figure 6:
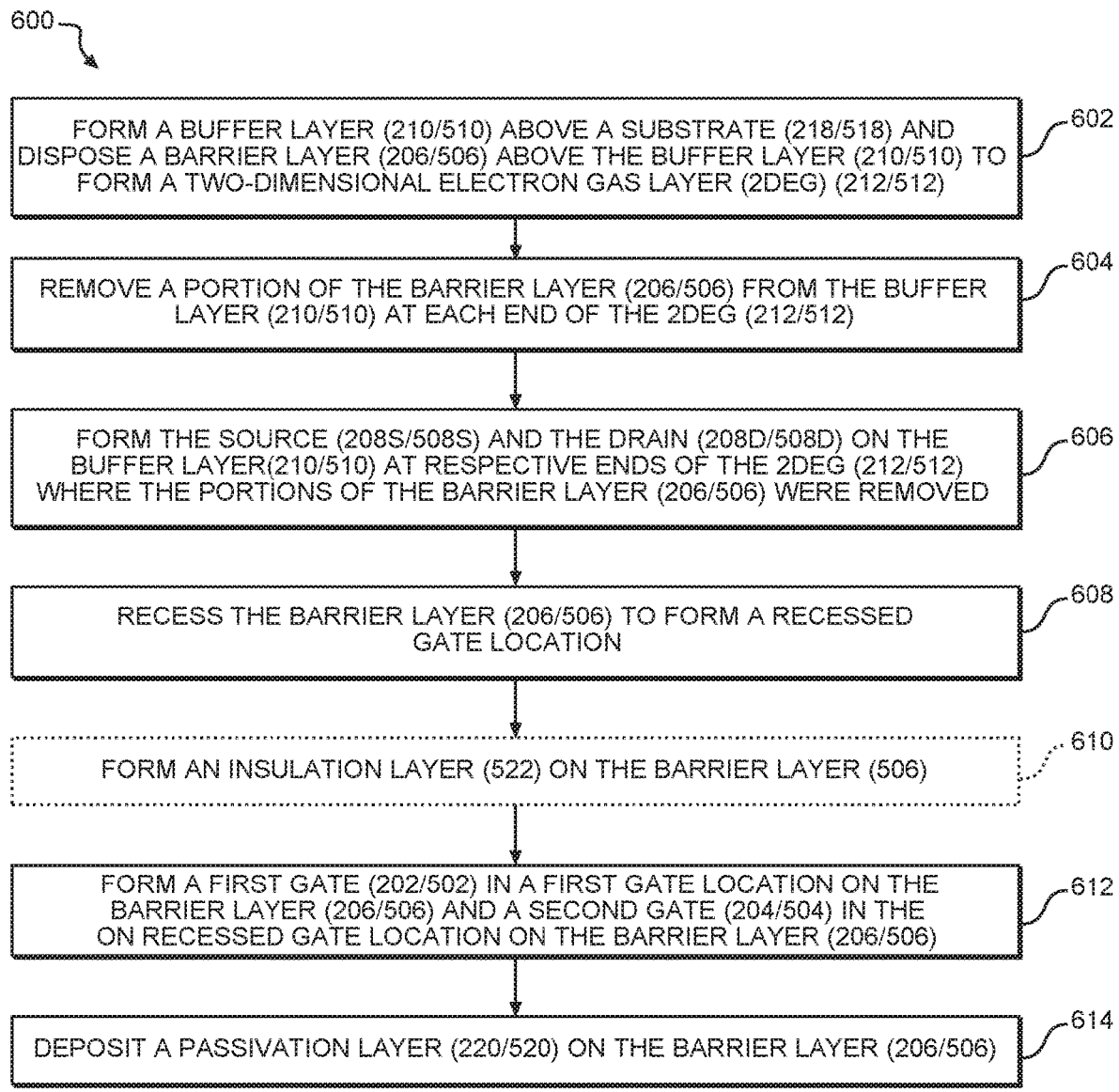
FIG. 6 is a flowchart of an exemplary method for fabricating a multi-gate HEMT having tuned recess depth gates, including the exemplary multi-gate HEMTs in FIGS. 2 and 5.

FIG. 6 is a flowchart illustrating a method 600 of fabricating the HEMT 200 in FIG. 2 and the HEMT 500 in FIG. 5. The method 600 is described below with reference to stages of fabrication illustrated in FIGS. 7A-7G.

Figure 7A:
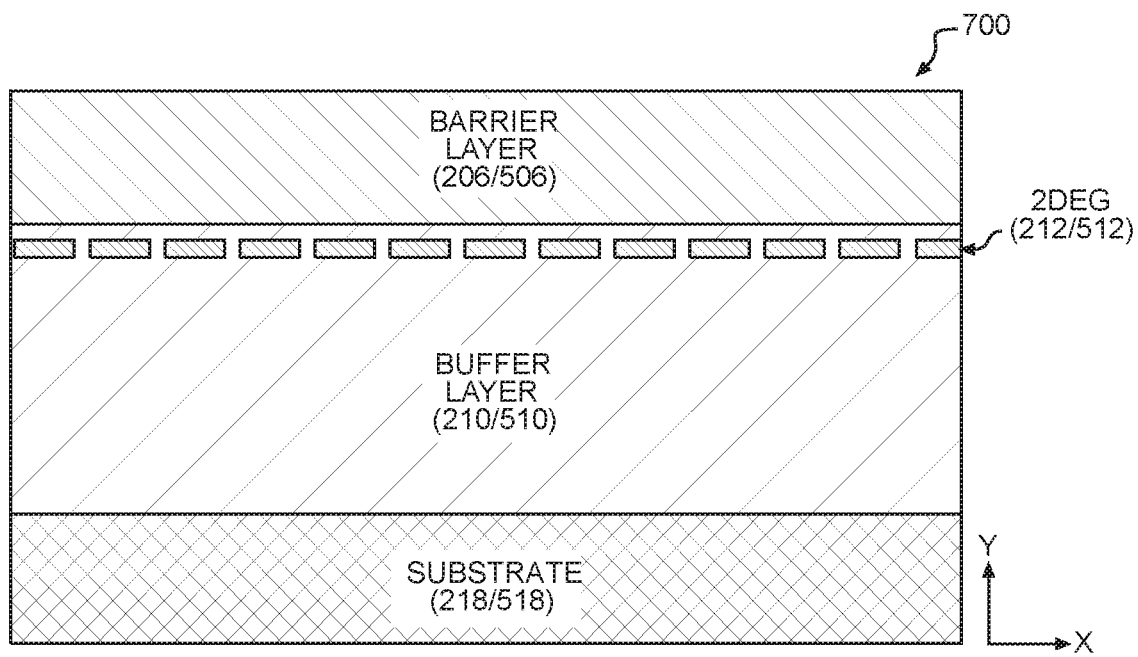
FIGS. 7A-7G are cross-sectional side views of a multi-gate HEMT having tuned recess depth gates in various exemplary fabrication stages of its fabrication according to the fabrication method in FIG. 6.

FIG. 7A shows a first fabrication stage 700 for fabricating the HEMT 200 and the HEMT 500. In the fabrication stage 700, the method 600 includes forming the buffer layer 210/510 (e.g., GaN) above the substrate 218/518 (e.g., SiC) extending in the X-axis direction and disposing the barrier layer 206/506 above (i.e., in the Y-axis direction) the buffer layer 210/510 to form the 2DEG 212/512 (block 602).

Figure 7B:
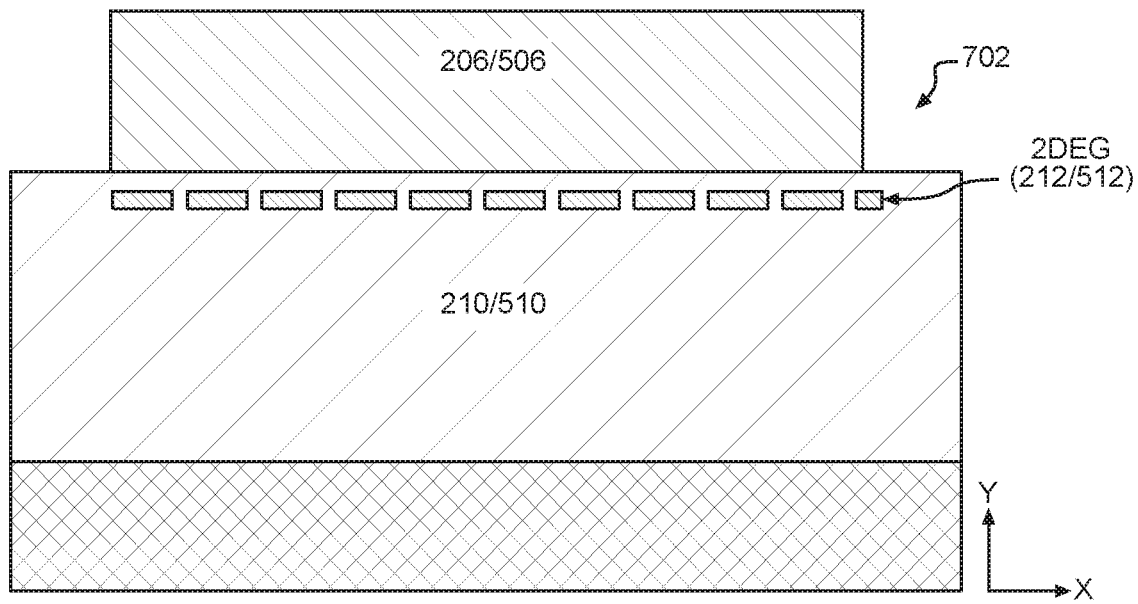

FIG. 7B illustrates a fabrication stage 702 including removing portions of the barrier layer 206/506 from the buffer layer 210/510 at each end (i.e., in the X-axis direction) of the 2DEG 212/512 (block 604).

Figure 7C:
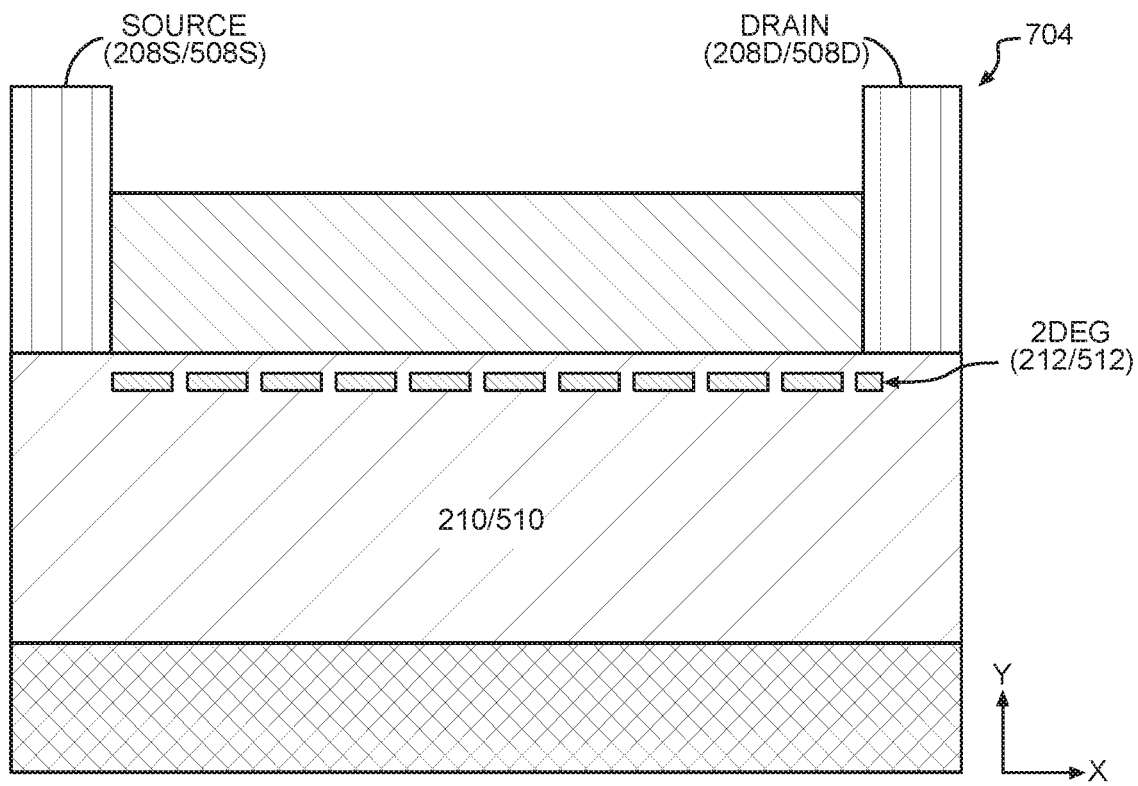

FIG. 7C illustrates a fabrication stage 704, which includes forming the source 208S/508S and the drain 208D/508D on the buffer layer 210/510 at respective ends of the 2DEG 212/512 where the portions of the barrier layer 206/506 are removed (block 606).

Figure 7D:
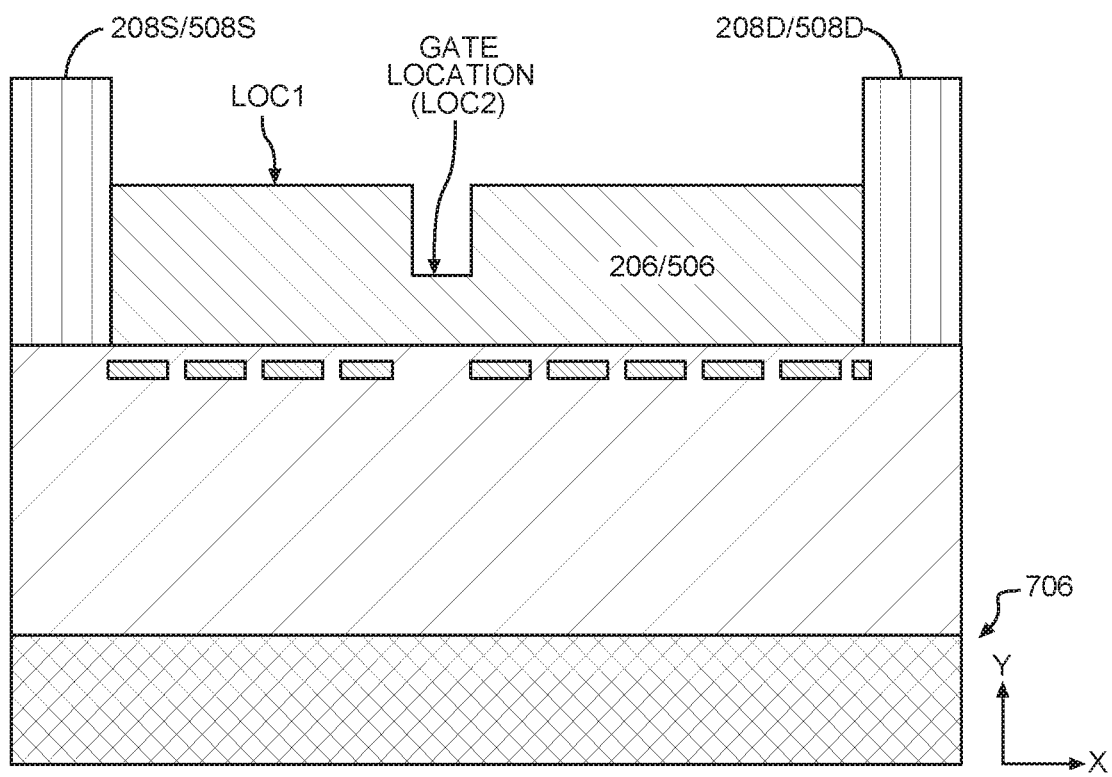

FIG. 7D illustrates a fabrication stage 706, which includes recessing the barrier layer 206/506 to form the recessed gate location LOC2 (block 608). The gate location LOC1 for the first gate 202/502 may or may not be recessed and the recessed gate location LOC2 is for the second gate 204/504. Recessing the barrier layer 206/506 in this regard includes thinning the barrier layer 206/506 by etching or other known processes to between 0% and 95% of the thickness $T_{205}/T_{506}$ in the Y-axis direction of the barrier layer 206/506. In the fabrication stage 706, the barrier layer 206/506 may be recessed in only one gate location LOC2 for the second gate 204/504 if the first gate 202/502 is not recessed (e.g., Lg1_rs=0). Alternatively, the barrier layer 206/506 may be recessed in a first location for the first gate 202/502 (e.g., Lg1_rs>0) and in a second location for the second gate 204/504 deeper than in the first location (e.g., Lg2_rs>Lg1_rs). In this regard, the barrier layer 206/506 is recessed the same or deeper for the second gate 204/504 than for the first gate 202/502. Recessing the barrier layer 206/506 in the fabrication stage 706 also determines the length Lg1 of the first gate 202/502 and the length Lg2 of the second gate 204/504 in the direction between the source 208S/508S and the drain 208D/508D.

Figure 7E:
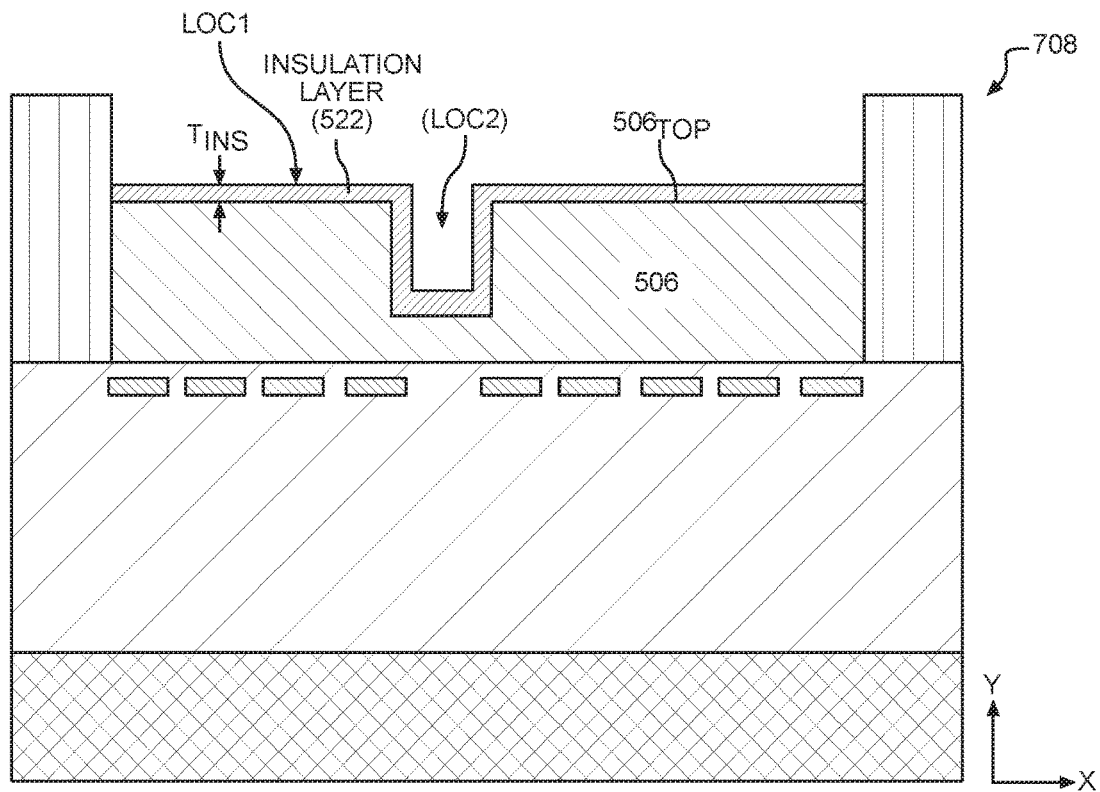

FIG. 7E illustrates an optional fabrication stage 708 that is included in the fabrication of the HEMT 500 in FIG. 5, but not in the fabrication of the HEMT 200 in FIG. 2. The fabrication stage 708 includes forming the insulation layer 522 on the barrier layer 506 (block 610). The insulation layer 522 is formed over the top surface $506_{TOP}$ of the barrier layer 506 and in the gate locations LOC1, LOC2 that are recessed for the first gate 502 and the second gate 504. If the optional fabrication stage 708 is executed to form the HEMT 500, an amount of material removed from the gate locations LOC1, LOC2 in the fabrication stage 706 is increased in both the X-axis direction and the Y-axis direction in consideration of a thickness $T_{INS}$ of the insulation layer 522 that is deposited on horizontal (X-axis direction) and vertical (Y-axis direction) surfaces in the locations LOC1, LOC2 in the fabrication stage 708. In other words, a depth of the recessed location(s) LOC1, LOC2 in the fabrication stage 706 for the HEMT 200 includes only the recess needed for a gate in direct contact with the barrier layer 206 (i.e., having a Schottky contact), but a depth of the recessed location(s) LOC1, LOC2 for the HEMT 500 includes the thickness $T_{INS}$ of the insulation layer 522 in addition to the recess for the first and second gates 502 and 504.

Figure 7F:
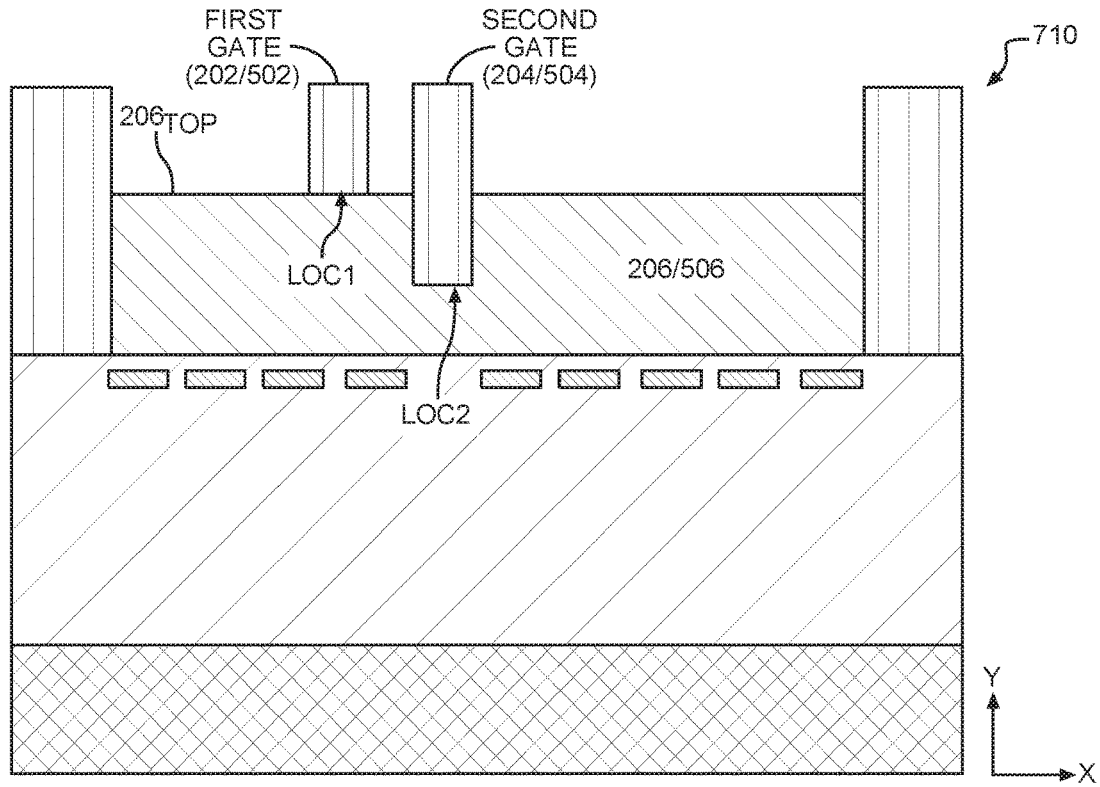

FIG. 7F illustrates a fabrication stage 710 including forming the first gate 202/502 in the first gate location LOC1 on the barrier layer 206/506 and forming the second gate 204/504 in the recessed gate location on the barrier layer 206/506 (block 612). When fabricating the HEMT 200, the fabrication stage 710 includes forming the first gate 202 directly on the top surface $206_{TOP}$ of the barrier layer 206 or directly on the barrier layer 206 in the first etched location LOC1. In this regard, the fabrication stage 710 would include forming the second gate 204 directly on the barrier layer 206 in the deeper recessed location LOC2. When fabricating the HEMT 500, the fabrication stage 710 may include forming the first gate 502 on the first gate insulator 524 on the top surface $506_{TOP}$ of the barrier layer 506 or where the gate location LOC1 is recessed (not shown). In this regard, the fabrication stage 710 would also include forming the second gate 504 on the second gate insulator 526 (see FIG. 5) on the barrier layer 506 in the deeper recessed location LOC2.

Figure 7G:
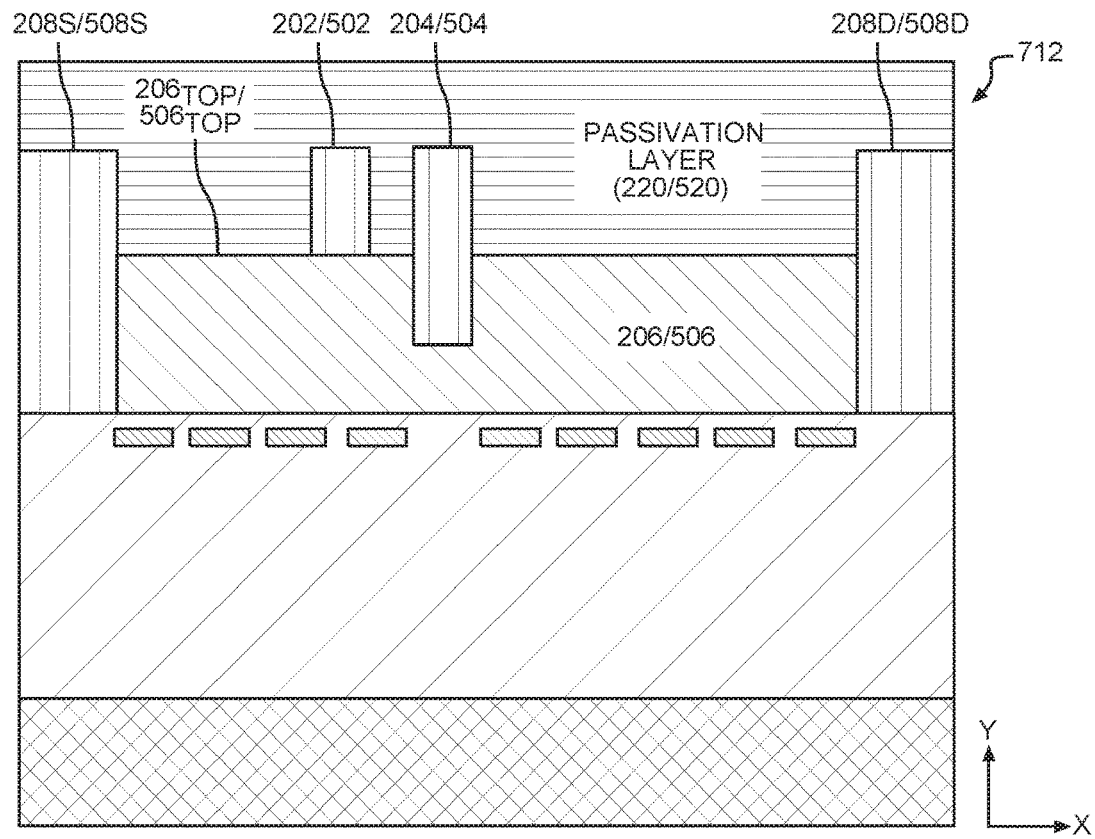

FIG. 7G illustrates a fabrication stage 712 including depositing the passivation layer 220/520 on the barrier layer 206/506 (block 614). The passivation layer 220/520 protects the top surface $206_{TOP}/506_{TOP}$ of the barrier layer 206/506. Initially, the thickness of the passivation layer 220/520 may cover the first gate 202/502 and the second gate 204/504. Subsequently, the passivation layer 220/520 may be planarized (i.e., reduced in the Y-axis direction) to expose the source 208S/508S, the drain 208D/508D, the first gate 202/502, and the second gate 204/504 for connections to a circuit.

Figure 8:
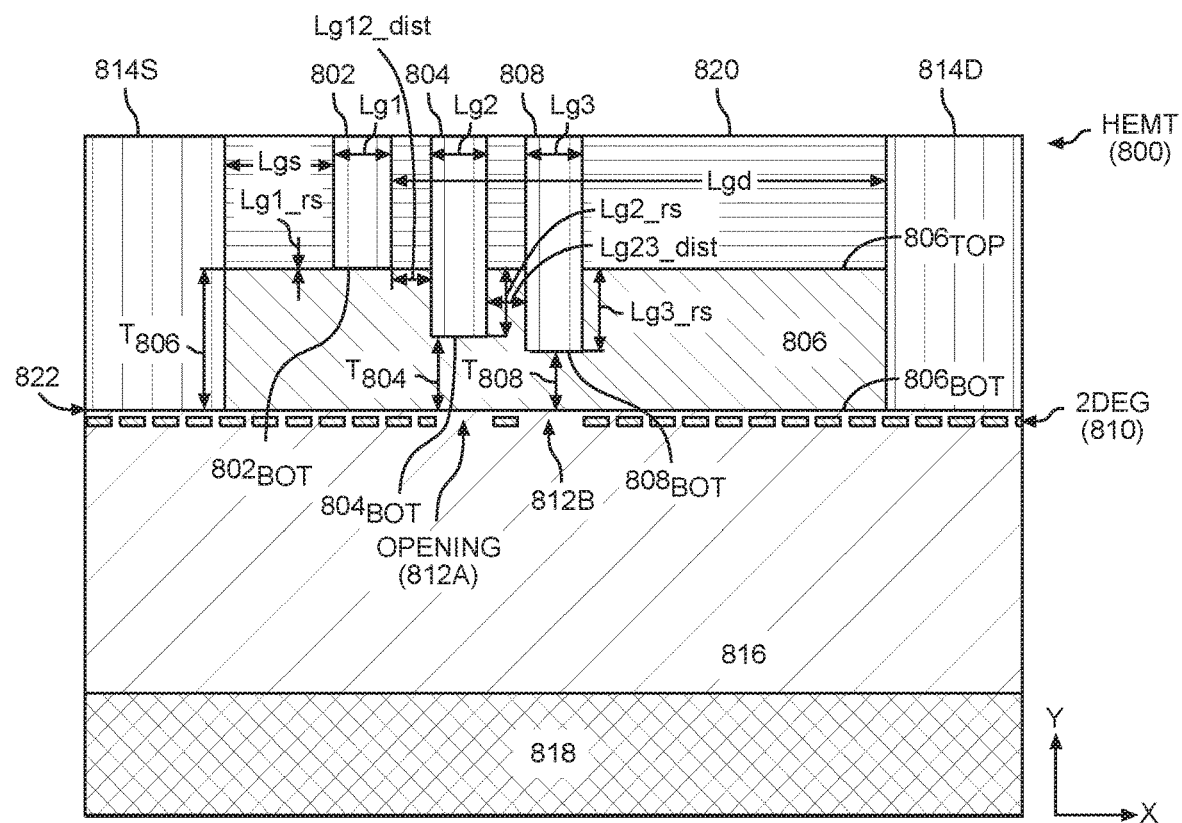
FIG. 8 is cross-sectional side view of an exemplary tri-gate HEMT having tuned recess depth gates that includes three (3) gates including a first Schottky gate recessed into a barrier layer the same depth or deeper depth than a second Schottky gate, and a third gate recessed the same depth or deeper depth than the first Schottky gate, to increase linearity of the transconductance of the HEMT and positively shift a threshold voltage.

FIG. 8 is a cross-sectional view of an exemplary HEMT 800, similar to the HEMT 200 in FIG. 2, including a first gate 802, and a second gate 804 including a bottom surface $804_{BOT}$ recessed a depth into a barrier layer 806 deeper than the bottom surface of the first gate 802. However, the HEMT 800 also includes a third gate 808 recessed a depth into the barrier layer 806 that is the same or deeper than the depth of the bottom surface of the second gate 804. In the HEMT 800, the second gate 804 and the third gate 808 are recessed such that the barrier layer 806 has thicknesses $T_{804}$ under the second gate 804 and thickness $T_{808}$ under the third gate 808. The thicknesses $T_{804}$ and $T_{808}$ are thinner in the Y-axis direction than a thickness $T_{806}$ of the barrier layer 806. The thinner barrier layer 806 beneath the second gate 804 and the third gate 808 depletes the high mobility carriers in a 2DEG conductive channel 810, creating openings 812A and 812B. By applying a gate-to-source voltage higher than the voltage threshold to the first, second, and third gates 802, 804, 808, the 2DEG conductive channel 810 is formed between a source 814S and a drain 814D. Depending on a voltage differential between the source 814S and the drain 814D, when a gate-to-source voltage higher than the threshold voltage is applied to the HEMT 800, current will flow in the 2DEG conductive channel 810.

Regarding further structural features of the HEMT 800, the barrier layer 806 is disposed on a buffer layer 816, which is disposed on a substrate 818. A passivation layer 820 is formed on a top surface $806_{TOP}$ of the barrier layer 806. Like the HEMT 200 in FIG. 2 and the HEMT 500 in FIG. 5, the distance between the first gate 802 and the second gate 804 is Lg12_dist. Dimensions of features of the HEMT 800 correspond to dimensions of like features in the HEMT 200 and the HEMT 500. In the HEMT 800, a distance Lg23_dist between the second gate 804 and the third gate 808 is equal to Lg12_dist. In the example in FIG. 8, the distance Lg12_dist is equal to the distance Lg23_dist and both are at or about 0.2 µm. However, the distance Lg12_dist and the distance Lg23_dist are not limited to being equal and each can be in the range of 0 µm to 2.0 µm. A distance Lgs, between the first gate 802 and the source 814S, is in the range of one (1) to three (3) µm, and a distance Lgd, between the first gate 802 and the drain 814D, is in the range of one (1) to ten (10) µm. The length Lg2 of the second gate 804 in the direction between the source 814S and the drain 814D is equal to the length Lg1 of the first gate 802 in the direction, and the length Lg3 of the third gate 808 in the direction is equal to the length Lg2. The lengths Lg1, Lg2, and Lg3 are each at or about 0.2 µm, but may each be tuned to any length in the range from 300 nm to 2.0 µm to attain desired threshold voltage shift and transconductance linearity. In addition, the depths Lg1_rs, Lg2_rs, and Lg3_rs to which the bottom surfaces of the first gate 802, the second gate 804, and the third gate 808, respectively, are recessed below the top surface of the barrier layer 806 may be in a range up to a depth equal to the thickness $T_{806}$ of the barrier layer 806.

In the example in FIG. 8, a bottom surface $802_{BOT}$ of the first gate 802 is in direct contact with the top surface $806_{TOP}$ of the barrier layer 806, but the bottom surface $802_{BOT}$ of the first gate 802 may be recessed a depth into the barrier layer 806 below the top surface $806_{TOP}$ of the barrier layer 806. In one example, in a barrier layer 806 having a thickness $T_{806}$ of 20 nm, Lg2_rs may be up to 16 nm, Lg3_rs may be up to 18 nm, and Lg1_rs is less than Lg2_rs. In this example, the buffer layer 816 has a thickness of 2.0 µm and the passivation layer 820 has a thickness $T_{PASS}$ of 50 nm to a few micrometers. The composition of the barrier layer 806 may be varied as described with regard to the barrier layer 206 in FIG. 2.

The HEMT 800 includes the buffer layer 816 on the substrate 818, the barrier layer 806 on the buffer layer 816, and the 2DEG conductive channel 810 at a heterojunction 822 between the buffer layer 816 and a bottom surface $806_{BOT}$ of the barrier layer 806. The HEMT 800 includes the source 814S and the drain 814D each electrically coupled to the 2DEG conductive channel 810. The HEMT 800 includes the first gate 802, the second gate 804, and the third gate 808. The first gate 802 includes the bottom surface $802_{BOT}$ in direct contact with the barrier layer 806 between the source 814S and the drain 814D. The second gate 804 is between the first gate 802 and the drain 814D, and a bottom surface $804_{BOT}$ of the second gate 804 is in direct contact with the barrier layer 806 and recessed a depth into the barrier layer 806 below the bottom surface $802_{BOT}$ of the first gate 802. The third gate 808 is in direct contact with the barrier layer 806 between the second gate 804 and the drain 814D, and a bottom surface $808_{BOT}$ of the third gate 808 is recessed a depth into the barrier layer 806 to a same depth or deeper depth than the bottom surface $804_{BOT}$ of the second gate 804 in the barrier layer 806.

The second bottom surface $804_{BOT}$ of the second gate 804 and the third bottom surface $808_{BOT}$ of the third gate 808 are recessed into the barrier layer 806 distances below the top surface $806_{TOP}$ each having a range of 5% to 100% of the thickness $T_{806}$ of the barrier layer 806.

Figure 9A:
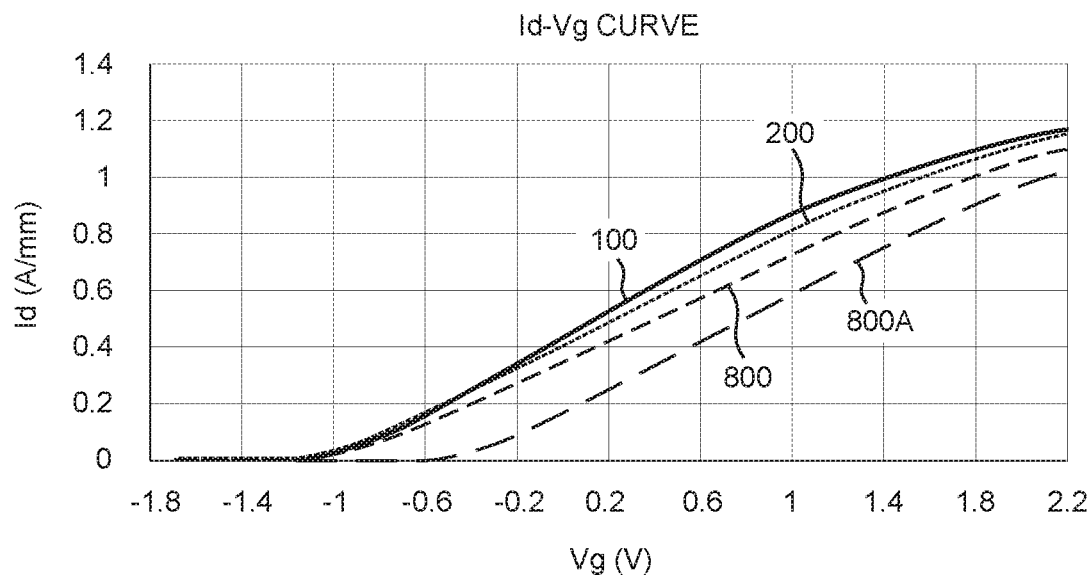
FIGS. 9A-9B are graphs illustrating simulated drain currents and transconductance over a range of gate voltages for a conventional HEMT in FIG. 1, the multi-gate HEMT in FIG. 2, the tri-gate HEMT with its first and third gates recessed the same depth into its barrier layer, and a tri-gate HEMT with a third gate recessed deeper in its barrier layer than a first gate.
Figure 9B:
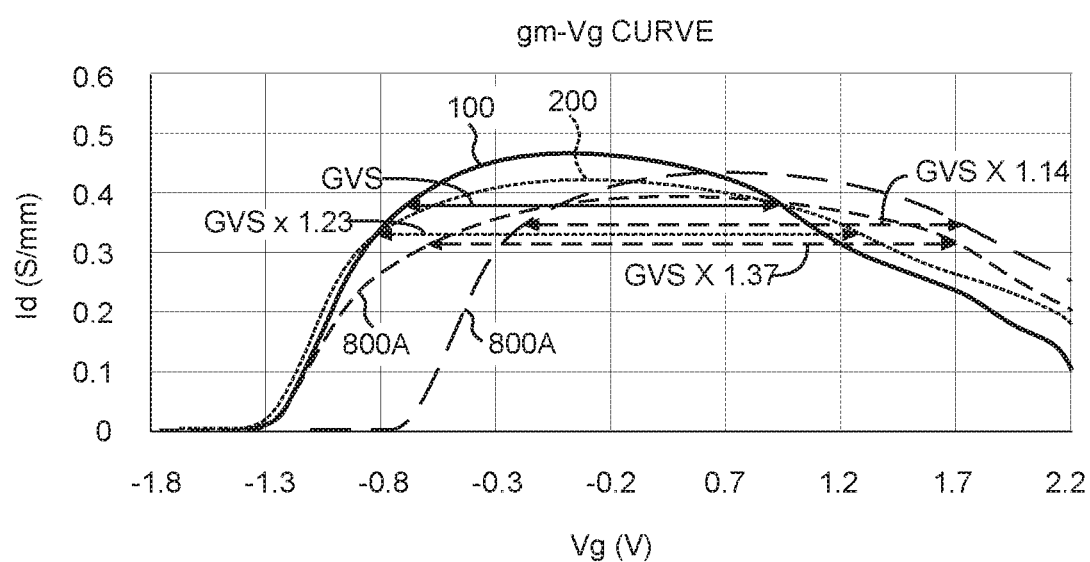

In FIGS. 9A and 9B, results of a simulation of the HEMT 800 with Lg2_rs=Lg3_rs=15 nm, and a simulation of another HEMT 800A with Lg2_rs=15 nm and Lg3_rs=18 nm are illustrated together with simulations of the single recessed-gate HEMT 100 in FIG. 1 and the HEMT 200 in FIG. 2. Dimensions of other features of the HEMT 800 and HEMT 800A correspond to the same features in the HEMT 200 in FIG. 2.

As shown in FIG. 9A, although the current output $I_d$ of the simulation of HEMT 800A at any input voltage Vg is not as high as the currents $I_d$ of the other simulations, the simulation of the HEMT 800A has a significantly more positive threshold voltage compared to the other examples. However, FIG. 9B shows that the linear range of transconductance of the HEMT 800A is only 14% longer than that of the recessed-gate HEMT 100 in FIG. 1.

In comparison, the HEMT 800 has approximately the same threshold voltage as the HEMT 100 but has a 37% longer GVS. The dimensions of the HEMT 800 discussed above may all be varied to tune the HEMT 800 to a desired combination of positive threshold voltage shift and linear transconductance range. Multi-gate HEMTs having progressively deeper recessed gates have significant benefits for improving device linearity without negatively affecting threshold voltage. Like the multi-gate HEMTs 200 and 500 in FIGS. 2 and 5, the tri-gate HEMT 800 in FIG. 8 achieves flatter transconductance ($g_m$) over a wider range of gate-to-source voltages than single recessed-gate HEMTs to allow for a high output current over a greater range of input voltage. Simulation has demonstrated up to a 42% improvement in transconductance linearity (i.e., GVS) over the HEMT 100 in FIG. 1. Moreover, the transconductance flatness and threshold voltage are tunable by using multiple gates with increasing recess depths from a source side gate to a drain side gate, which provides significant freedom in designing highly linear GaN HEMTs for varieties of circuit design purposes, such as different threshold voltage or operation frequency requirements.

A HEMT including a multi-gate structure with at least one gate recessed a different depth into the barrier layer than another gate to positively shift the threshold voltage and improve the linearity of transconductance of the HEMT over a range of gate-to-source voltages, as illustrated in any of FIGS. 2, 5, and 8, according to any aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 10:
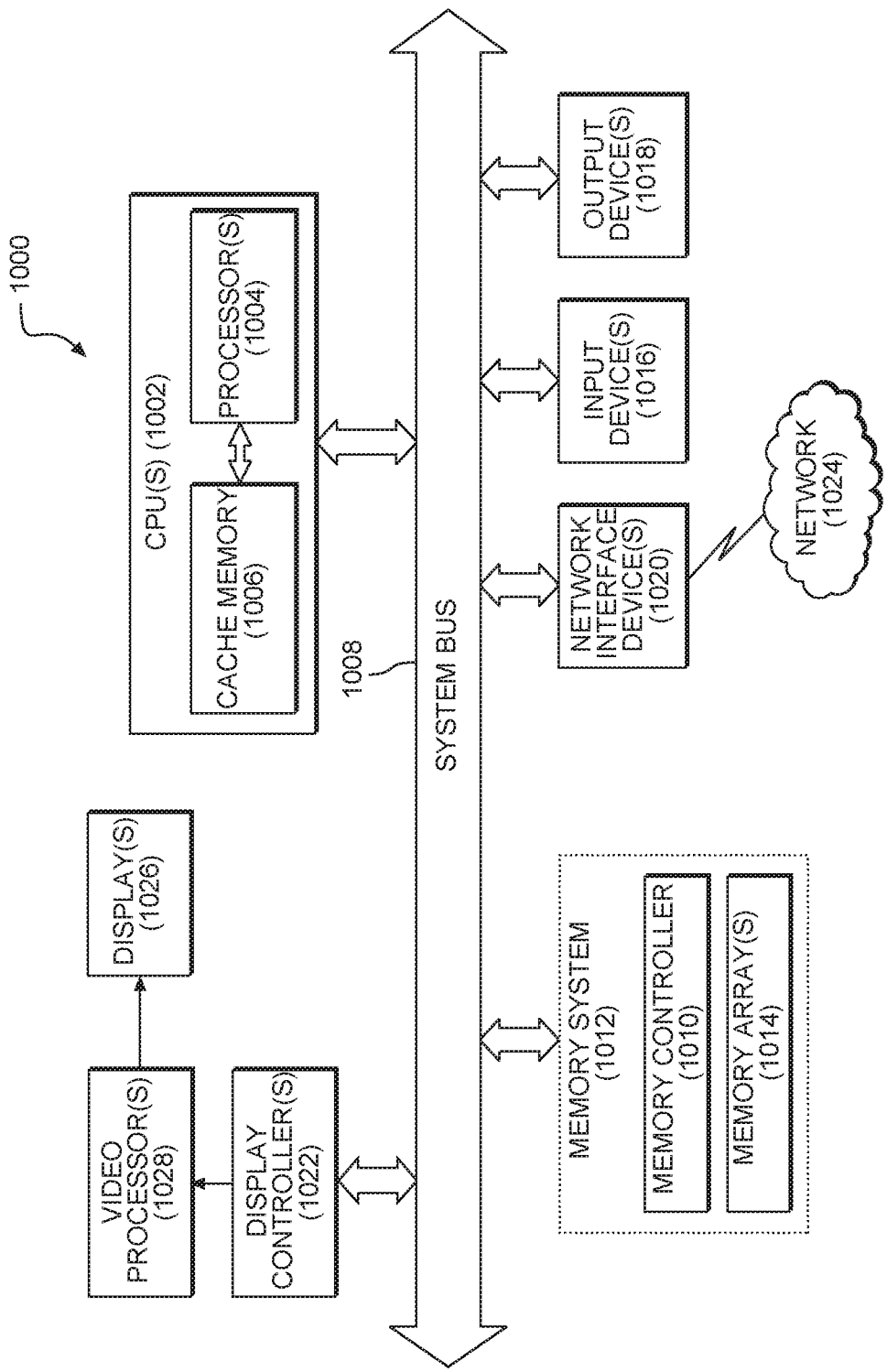
FIG. 10 is a block diagram of an exemplary processor-based system that can include a multi-gate HEMT having tuned recess depth gates, to increase linearity of the transconductance of the HEMT and positively shift the threshold voltage, including but not limited to any of the multi-gate HEMTs in FIGS. 2, 5, and 8.

In this regard, FIG. 10 illustrates an example of a processor-based system 1000 including a HEMT including a multi-gate structure with at least one gate recessed a different depth into the barrier layer than another gate to positively shift the threshold voltage and improve the linearity of transconductance of the HEMT over a range of gate-to-source voltages, as illustrated in any of FIGS. 2, 5, and 8, and according to any aspects disclosed herein. In this example, the processor-based system 1000 includes one or more central processor units (CPUs) 1002, which may also be referred to as CPU or processor cores, each including one or more processors 1004. The CPU(s) 1002 may have cache memory 1006 coupled to the processor(s) 1004 for rapid access to temporarily stored data. As an example, the processor(s) 1004 could include a HEMT including a multi-gate structure with at least one gate recessed a different depth into the barrier layer than another gate to positively shift the threshold voltage and improve the linearity of transconductance of the HEMT over a range of gate-to-source voltages, as illustrated in any of FIGS. 2, 5, and 8, and according to any aspects disclosed herein. The CPU(s) 1002 is coupled to a system bus 1008 and can intercouple master and slave devices included in the processor-based system 1000. As is well known, the CPU(s) 1002 communicates with these other devices by exchanging address, control, and data information over the system bus 1008. For example, the CPU(s) 1002 can communicate bus transaction requests to a memory controller 1010 as an example of a slave device. Although not illustrated in FIG. 10, multiple system buses 1008 could be provided, wherein each system bus 1008 constitutes a different fabric.

Other master and slave devices can be connected to the system bus 1008. As illustrated in FIG. 10, these devices can include a memory system 1012 that includes the memory controller 1010 and one or more memory arrays 1014, one or more input devices 1016, one or more output devices 1018, one or more network interface devices 1020, and one or more display controllers 1022, as examples. Each of the memory system 1012, the one or more input devices 1016, the one or more output devices 1018, the one or more network interface devices 1020, and the one or more display controllers 1022 can include a HEMT including a multi-gate structure with at least one gate recessed a different depth into the barrier layer than another gate to positively shift the threshold voltage and improve the linearity of transconductance of the HEMT over a range of gate-to-source voltages, as illustrated in any of FIGS. 2, 5, and 8, and according to any aspects disclosed herein. The input device(s) 1016 can include any type of input device, including, but not limited to, input keys, switches, voice processors, etc. The output device(s) 1018 can include any type of output device, including, but not limited to, audio, video, other visual indicators, etc. The network interface device(s) 1020 can be any device configured to allow exchange of data to and from a network 1024. The network 1024 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1020 can be configured to support any type of communications protocol desired.

The CPU(s) 1002 may also be configured to access the display controller(s) 1022 over the system bus 1008 to control information sent to one or more displays 1026. The display controller(s) 1022 sends information to the display(s) 1026 to be displayed via one or more video processors 1028, which process the information to be displayed into a format suitable for the display(s) 1026. The display(s) 1026 can include any type of display, including, but not limited to, a cathode ray tube (CRT), a liquid crystal display (LCD), a plasma display, a light emitting diode (LED) display, etc. The display controller(s) 1022, display(s) 1026, and/or the video processor(s) 1028 can include HEMT including a multi-gate structure with at least one gate recessed a different depth into the barrier layer than another gate to positively shift the threshold voltage and improve the linearity of transconductance of the HEMT over a range of gate-to-source voltages, as illustrated in any of FIGS. 2, 5, and 8, and according to any aspects disclosed herein.

Figure 11:
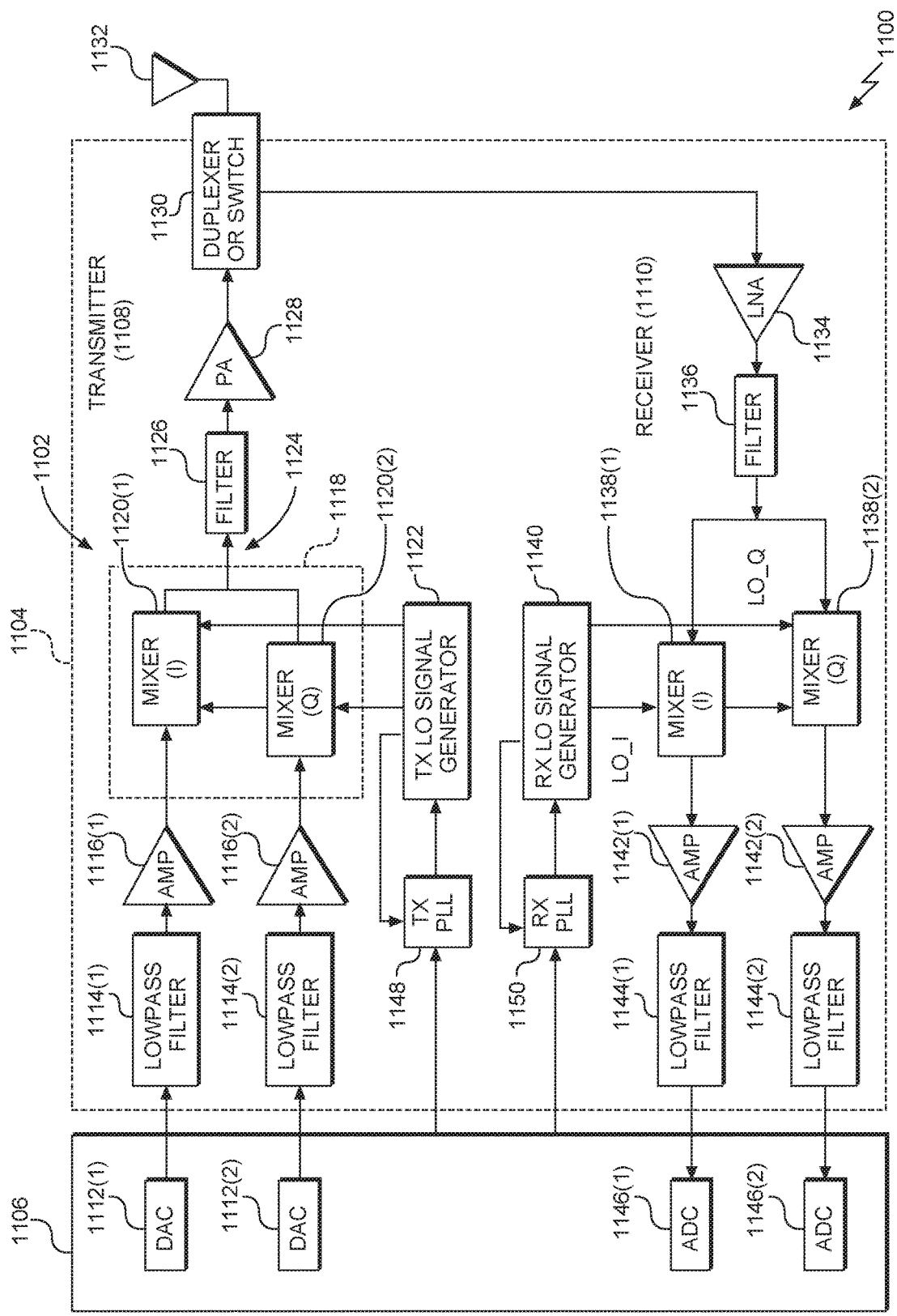
FIG. 11 is a block diagram of an exemplary wireless communications device that includes radio frequency (RF) components formed from an integrated circuit (IC), including a multi-gate HEMT having tuned recess depth gates, to increase linearity of the transconductance of the HEMT and positively shift the threshold voltage, including but not limited to any of the multi-gate HEMTs in FIGS. 2, 5, and 8.

FIG. 11 illustrates an exemplary wireless communications device 1100 that includes radio frequency (RF) components formed from an integrated circuit (IC) 1102, wherein any of the components therein can include a HEMT including a multi-gate structure with at least one gate recessed a different depth into the barrier layer than another gate to positively shift the threshold voltage and improve the linearity of transconductance of the HEMT over a range of gate-to-source voltages, as illustrated in any of FIGS. 2, 5, and 8, and according to any aspects disclosed herein. The wireless communications device 1100 may include or be provided in any of the above-referenced devices, as examples. As shown in FIG. 11, the wireless communications device 1100 includes a transceiver 1104 and a data processor 1106. The data processor 1106 may include a memory to store data and program codes. The transceiver 1104 includes a transmitter 1108 and a receiver 1110 that support bi-directional communications. In general, the wireless communications device 1100 may include any number of transmitters 1108 and/or receivers 1110 for any number of communication systems and frequency bands. All or a portion of the transceiver 1104 may be implemented on one or more analog ICs, RF ICs (RFICs), mixed-signal ICs, etc.

The transmitter 1108 or the receiver 1110 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 1110. In the direct-conversion architecture, a signal is frequency-converted between RF and baseband in one stage. The super-heterodyne and direct-conversion architectures may use different circuit blocks and/or have different requirements. In the wireless communications device 1100 in FIG. 11, the transmitter 1108 and the receiver 1110 are implemented with the direct-conversion architecture.

In the transmit path, the data processor 1106 processes data to be transmitted and provides I and Q analog output signals to the transmitter 1108. In the exemplary wireless communications device 1100, the data processor 1106 includes digital-to-analog converters (DACs) 1112(1), 1112(2) for converting digital signals generated by the data processor 1106 into the I and Q analog output signals, e.g., I and Q output currents, for further processing.

Within the transmitter 1108, lowpass filters 1114(1), 1114(2) filter the I and Q analog output signals, respectively, to remove undesired signals caused by the prior digital-to-analog conversion. Amplifiers (AMPs) 1116(1), 1116(2) amplify the signals from the lowpass filters 1114(1), 1114(2), respectively, and provide I and Q baseband signals. An upconverter 1118 upconverts the I and Q baseband signals with I and Q transmit (TX) local oscillator (LO) signals through mixers 1120(1), 1120(2) from a TX LO signal generator 1122 to provide an upconverted signal 1124. A filter 1126 filters the upconverted signal 1124 to remove undesired signals caused by the frequency upconversion as well as noise in a receive frequency band. A power amplifier (PA) 1128 amplifies the upconverted signal 1124 from the filter 1126 to obtain the desired output power level and provides a transmitted RF signal. The transmitted RF signal is routed through a duplexer or switch 1130 and transmitted via an antenna 1132.

In the receive path, the antenna 1132 receives signals transmitted by base stations and provides a received RF signal, which is routed through the duplexer or switch 1130 and provided to a low noise amplifier (LNA) 1134. The duplexer or switch 1130 is designed to operate with a specific receive (RX)-to-TX duplexer frequency separation, such that RX signals are isolated from TX signals. The received RF signal is amplified by the LNA 1134 and filtered by a filter 1136 to obtain a desired RF input signal. Downconversion mixers 1138(1), 1138(2) mix the output of the filter 1136 with I and Q RX LO signals (i.e., LO_I and LO_Q) from an RX LO signal generator 1140 to generate I and Q baseband signals. The I and Q baseband signals are amplified by AMPs 1142(1), 1142(2) and further filtered by lowpass filters 1144(1), 1144(2) to obtain I and Q analog input signals, which are provided to the data processor 1106. In this example, the data processor 1106 includes analog-to-digital Converters (ADCs) 1146(1), 1146(2) for converting the analog input signals into digital signals to be further processed by the data processor 1106.

In the wireless communications device 1100 of FIG. 11, the TX LO signal generator 1122 generates the I and Q TX LO signals used for frequency upconversion, while the RX LO signal generator 1140 generates the I and Q RX LO signals used for frequency downconversion. Each LO signal is a periodic signal with a particular fundamental frequency. A TX phase-locked loop (PLL) circuit 1148 receives timing information from the data processor 1106 and generates a control signal used to adjust the frequency and/or phase of the TX LO signals from the TX LO signal generator 1122. Similarly, an RX PLL circuit 1150 receives timing information from the data processor 1106 and generates a control signal used to adjust the frequency and/or phase of the RX LO signals from the RX LO signal generator 1140.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but, is to be accorded the widest scope consistent with the principles and novel features disclosed herein.

In the following, further examples of the present disclosure are provided:

1. A high electron mobility transistor (HEMT), comprising:
    a buffer layer above a substrate;
    a barrier layer above the buffer layer;
    a two-dimensional electron gas layer (2DEG) conductive channel at a heterojunction between the buffer layer and a bottom surface of the barrier layer;
    a source and a drain each electrically coupled to the 2DEG conductive channel;
    a first gate comprising a bottom surface in direct contact with the barrier layer between the source and the drain, a length of the first gate extends in a direction from the source to the drain; and
    a second gate between the first gate and the drain, the second gate comprising a second bottom surface in direct contact with the barrier layer and recessed a depth into the barrier layer deeper than the bottom surface of the first gate, and a length of the second gate extends in the direction.
2. The HEMT of example 1, wherein the barrier layer comprises a top surface.
3. The HEMT of example 2, wherein the bottom surface of the first gate is in direct contact with the top surface of the barrier layer.
4. The HEMT of examples 2-3, wherein the bottom surface of the first gate is recessed into the barrier layer below the top surface of the barrier layer.
5. The HEMT of any of the examples 2-4, wherein:
    a thickness of the barrier layer is a distance between the top surface of the barrier layer and the bottom surface of the barrier layer; and
    the depth the second bottom surface of the second gate is recessed into the barrier layer is a distance below the top surface of the barrier layer having a range of 5% to 100% of the thickness of the barrier layer.
6. The HEMT of any of the examples 1-5, wherein the length of the second gate is equal to the length of the first gate.
7. The HEMT of any of the examples 1-6, wherein the length of the first gate and the length of the second gate are each in the range from 0.03 to 2.0 microns ($\mu m$).
8. The HEMT of any of the examples 1-7, wherein a distance from the first gate to the second gate in the direction is equal to the length of the first gate.
9. The HEMT of any of the examples 1-8, wherein a distance between the first gate and the second gate in the direction is in a range between 0 $\mu m$ and 2.0 $\mu m$ in the direction.
10. The HEMT of example 6, wherein:
    the length of the first gate and the length of the second gate are each about 0.2 microns ($\mu m$); and
    a distance between the first gate and the second gate in the direction is in the range of 0.2 $\mu m$ to 0.8 $\mu m$.
11. The HEMT of example 1, wherein the barrier layer comprises aluminum gallium nitride (AlGaN) and the buffer layer comprises gallium nitride (GaN).
12. The HEMT of any of the examples 1-11 integrated in an integrated circuit (IC).
13. The HEMT of any of the examples 1-12, integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems: a drone; and a multicopter.
14. A high electron mobility transistor (HEMT), comprising:
    a buffer layer above a substrate;
    a barrier layer above the buffer layer;
    a two-dimensional electron gas layer (2DEG) conductive channel at a heterojunction between the buffer layer and a bottom surface of the barrier layer;
    a source and a drain each electrically coupled to the 2DEG conductive channel;
    a first gate comprising a bottom surface on the barrier layer between the source and the drain;
    a first gate insulator between the bottom surface of the first gate and the barrier layer, and a length of the first gate extends in a direction from the source to the drain;
    a second gate between the first gate and the drain, the second gate comprising a second bottom surface recessed a depth into the barrier layer deeper than the bottom surface of the first gate, and a length of the second gate extends in the direction; and
    a second gate insulator between the second bottom surface of the second gate and the barrier layer.
15. The HEMT of example 14, wherein the barrier layer comprises a top surface.
16. The HEMT of example 15, wherein the first gate insulator is disposed on the top surface of the barrier layer.
17. The HEMT of any of the examples 15-16, wherein the first gate insulator is recessed into the barrier layer below the top surface of the barrier layer.
18. The HEMT of any of the examples 15-17, wherein:
    a thickness of the barrier layer is a distance between the top surface of the barrier layer and the bottom surface of the barrier layer; and
    the depth the second bottom surface of the second gate is recessed into the barrier layer is a distance below the top surface of the barrier layer having a range of 5% to 100% of the thickness of the barrier layer.

19. The HEMT of any of the examples 14-18, wherein the length of the second gate is equal to the length of the first gate.
20. The HEMT of any of the examples 14-19, wherein the length of the first gate and the length of the second gate are each in the range from 0.03 to 2.0 microns (μm).
21. The HEMT of any of the examples 14-20, wherein a distance from the first gate to the second gate in the direction is equal to the length of the first gate.
22. The HEMT of any of the examples 19-21, wherein a distance from the first gate to the second gate in the direction is in a range between 0 microns (μm) and 2.0 μm in the direction.
23. The HEMT of any of the examples 19-22, wherein:
    the length of the first gate and the length of the second gate are each about 0.2 microns (μm); and
    the distance from the first gate to the second gate is in the range of about 0.2 μm to about 0.8 μm.
24. The HEMT of example 14, wherein the barrier layer comprises aluminum gallium nitride (AlGaN) and the buffer layer comprises gallium nitride (GaN).
25. A high electron mobility transistor (HEMT), comprising:
    a buffer layer above a substrate;
    a barrier layer above the buffer layer;
    a two-dimensional electron gas layer (2DEG) conductive channel at a heterojunction between the buffer layer and a bottom surface of the barrier layer;
    a source and a drain each electrically coupled to the 2DEG conductive channel;
    a first gate comprising a bottom surface in direct contact with the barrier layer between the source and the drain, and a length of the first gate extends in a direction from the source to the drain;
    a second gate between the first gate and the drain, the second gate comprising a second bottom surface in direct contact with the barrier layer and recessed a depth into the barrier layer deeper than the bottom surface of the first gate, and a length of the second gate extends in the direction; and
    a third gate between the second gate and the drain, the third gate comprising a third bottom surface in direct contact with the barrier layer and recessed a depth into the barrier layer the same or deeper than the depth of the second bottom surface of the second gate in the barrier layer, and a length of the third gate extends in the direction.
26. The HEMT of example 25, wherein the barrier layer comprises a top surface.
27. The HEMT of example 26, wherein the bottom surface of the first gate is in direct contact with the top surface of the barrier layer.
28. The HEMT of any of the examples 26-27, wherein the bottom surface of the first gate is recessed into the barrier layer below the top surface of the barrier layer.
29. The HEMT of any of the examples 26-28, wherein:
    a thickness of the barrier layer is a distance between the top surface of the barrier layer and the bottom surface of the barrier layer;
    the depth the second bottom surface of the second gate is recessed into the barrier layer is a distance below the top surface of the barrier layer having a range of 5% to 100% of the thickness of the barrier layer; and
    the depth the third bottom surface of the third gate is recessed into the barrier layer is a distance below the top surface of the barrier layer having a range of 5% to 100% of the thickness of the barrier layer.
30. The HEMT of any of the examples 25-29, wherein:
    the length of the second gate is equal to the length of the first gate; and
    the length of the third gate is equal to the length of the second gate.
31. The HEMT of any of the examples 25-30, wherein the length of the first gate, the length of the second gate, and the length of the third gate are each in the range from 0.03 to 2.0 microns (μm).
32. The HEMT of any of the examples 25-31, wherein:
    a distance between the first gate and the second gate in the direction is equal to the length of the first gate; and
    a distance between the second gate and the third gate in the direction is equal to the length of the first gate.
33. The HEMT of any of the examples 25-32, wherein the distance from the first gate to the second gate in the direction and the distance from the second gate to the third gate in the direction are each in the range of about 0 μm to about 2.0 μm.
34. The HEMT of any of the examples 25-33, wherein the buffer layer comprises aluminum gallium nitride (AlGaN) and the barrier layer comprises gallium nitride (GaN).
35. A method of fabricating a HEMT, the method comprising:
    forming a buffer layer above a substrate;
    disposing a barrier layer above the buffer layer to form a two-dimensional electron gas layer (2DEG) conductive channel;
    removing portions of the barrier layer from the buffer layer at each end of the 2DEG conductive channel;
    forming a source and a drain on the buffer layer at respective ends of the 2DEG conductive channel where the portions of the barrier layer are removed;
    recessing the barrier layer to form a recessed gate location;
    forming a first gate in a first gate location on the barrier layer;
    forming a second gate in the recessed gate location on the barrier layer; and
    depositing a passivation layer on the barrier layer.

What is claimed is:
1. A high electron mobility transistor (HEMT), comprising:
    a buffer layer on a substrate, the buffer layer including a top surface;
    a source and a drain directly adjacent to the buffer layer;
    a barrier layer directly adjacent to the source and the drain and extending from the source to the drain directly adjacent to the top surface of the buffer layer, the barrier layer including a bottom surface in a same horizontal plane as a bottom surface of each of the source and drain;
    a two-dimensional electron gas layer (2DEG) conductive channel at a heterojunction between the buffer layer and a bottom surface of the barrier layer, the heterojunction extending from the source to the drain;
    a first gate comprising a bottom surface on a top surface of an insulation layer and over a top surface of the barrier layer between the source and the drain, and a length of the first gate extends in a first direction from the source to the drain; and
    a second gate between the first gate and the drain, the second gate comprising a second bottom surface, wherein:

the second bottom surface is recessed into the barrier layer;
the barrier layer between the second gate and the buffer layer is thinner than a thickness of the barrier layer between the first gate and the buffer layer; and
a length of the second gate extends in the first direction;
wherein the insulation layer comprises a first gate insulator between the bottom surface of the first gate and the barrier layer, and a second gate insulator between the second bottom surface of the second gate and the barrier layer, and a first distance between the first gate and the source is less than a second distance between the first gate and the drain.

2. The HEMT of claim 1, wherein the first gate insulator is disposed on the top surface of the barrier layer.

3. The HEMT of claim 1, wherein the second gate insulator is recessed below the top surface of the barrier layer.

4. The HEMT of claim 1, wherein the length of the second gate is equal to the length of the first gate.

5. The HEMT of claim 1, wherein the length of the first gate and the length of the second gate are each in the range from 0.03 to 2.0 microns (µm).

6. The HEMT of claim 1, wherein a distance from the first gate to the second gate in the first direction is equal to the length of the first gate.

7. The HEMT of claim 4, wherein a distance between the first gate and the second gate in the first direction is in a range between 0 microns (µm) and 2.0 µm.

8. The HEMT of claim 4, wherein:
the length of the first gate and the length of the second gate are each about 0.2 microns (µm); and
a distance from the first gate to the second gate in the first direction is in the range of about 0.2 µm to about 0.8 µm.

9. The HEMT of claim 1, wherein the barrier layer comprises aluminum gallium nitride (AlGaN) and the buffer layer comprises gallium nitride (GaN).

* * * * *